(12) United States Patent
Breymesser et al.

(10) Patent No.: US 11,856,711 B2
(45) Date of Patent: Dec. 26, 2023

(54) ROGOWSKI COIL INTEGRATED IN GLASS SUBSTRATE

(71) Applicant: Infineon Technologies Austria AG, Villach (AT)

(72) Inventors: Alexander Breymesser, Villach (AT); Francisco Javier Santos Rodriguez, Villach (AT); Klaus Sobe, Klagenfurt (AT)

(73) Assignee: Infineon Technologies Austria AG, Villach (AT)

( * ) Notice: Subject to any disclaimer, the term of this patent is extended or adjusted under 35 U.S.C. 154(b) by 496 days.

(21) Appl. No.: 17/082,697

(22) Filed: Oct. 28, 2020

(65) Prior Publication Data

US 2022/0132677 A1    Apr. 28, 2022

(51) Int. Cl.
| | |
|---|---|
| *H05K 3/40* | (2006.01) |
| *G01R 31/52* | (2020.01) |
| *H05K 1/03* | (2006.01) |
| *H05K 1/11* | (2006.01) |
| *H05K 1/16* | (2006.01) |
| *H05K 3/00* | (2006.01) |
| *H05K 3/10* | (2006.01) |

(52) U.S. Cl.
CPC ........... *H05K 3/4038* (2013.01); *G01R 31/52* (2020.01); *H05K 1/0306* (2013.01); *H05K 1/115* (2013.01); *H05K 1/165* (2013.01); *H05K 3/0029* (2013.01); *H05K 3/10* (2013.01); *H05K 2201/10151* (2013.01); *H05K 2203/107* (2013.01)

(58) Field of Classification Search
CPC .... H05K 3/4038; H05K 1/0306; H05K 1/115; H05K 1/165; H05K 3/0029; H05K 3/10; H05K 2201/10151; H05K 2203/107; G01R 31/52; G01R 3/00; G01R 15/181; G01R 19/0092; H01L 22/32; H01L 22/14; H01L 22/34
See application file for complete search history.

(56) References Cited

U.S. PATENT DOCUMENTS

| | | | |
|---|---|---|---|
| 7,227,441 B2 | 6/2007 | Skendzic et al. | |
| 8,742,539 B2 | 6/2014 | Weyers et al. | |
| 2002/0075028 A1* | 6/2002 | Toyama | G01R 31/2884 324/762.05 |
| 2017/0356935 A1* | 12/2017 | Hurwitz | G01R 19/12 |
| 2019/0131508 A1 | 5/2019 | Kasztelan et al. | |
| 2019/0277893 A1 | 9/2019 | Kashiwaya | |

FOREIGN PATENT DOCUMENTS

EP           3715868 A1    9/2020

* cited by examiner

*Primary Examiner* — Farhana A Hoque
(74) *Attorney, Agent, or Firm* — Murphy, Bilak & Homiller, PLLC

(57) ABSTRACT

A method of forming a current measurement device includes providing a glass substrate having first and second substantially planar surfaces that are opposite one another, forming a plurality of through-vias in the glass substrate that each extend between the first and second substantially planar surfaces, and forming conductive tracks on the glass substrate that connect adjacent ones of the through-vias together. Forming the plurality of through-vias includes applying radiation to the glass substrate, and the conductive tracks and the through-vias collectively form a coil structure in the glass substrate.

30 Claims, 24 Drawing Sheets

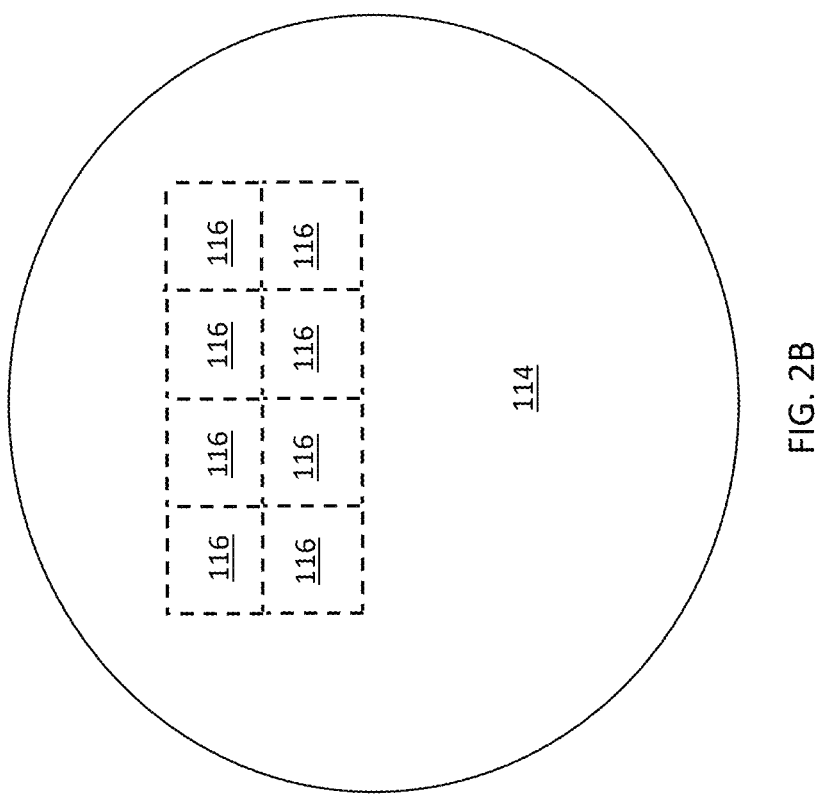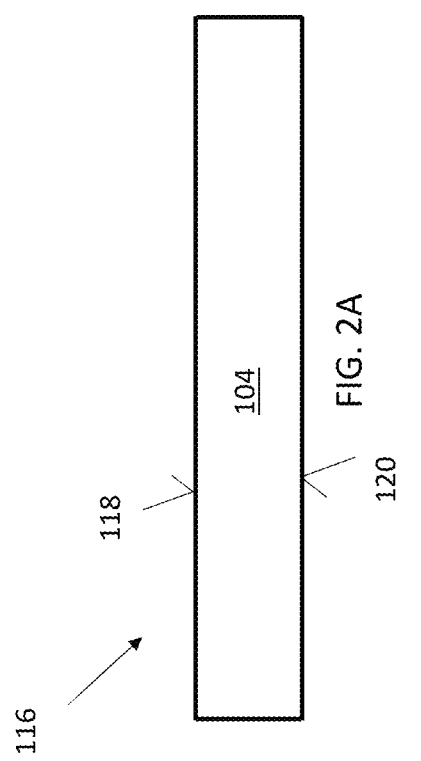
FIGURE 2

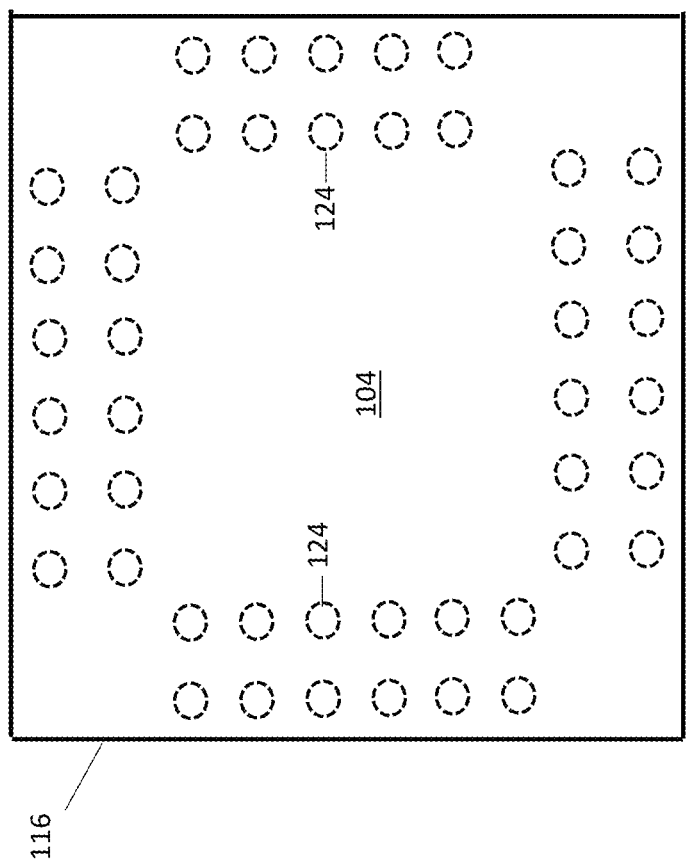
FIG. 3B
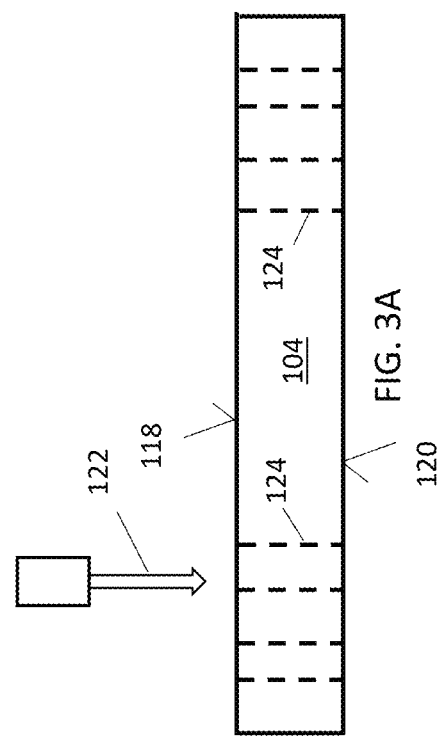
FIG. 3A
FIGURE 3

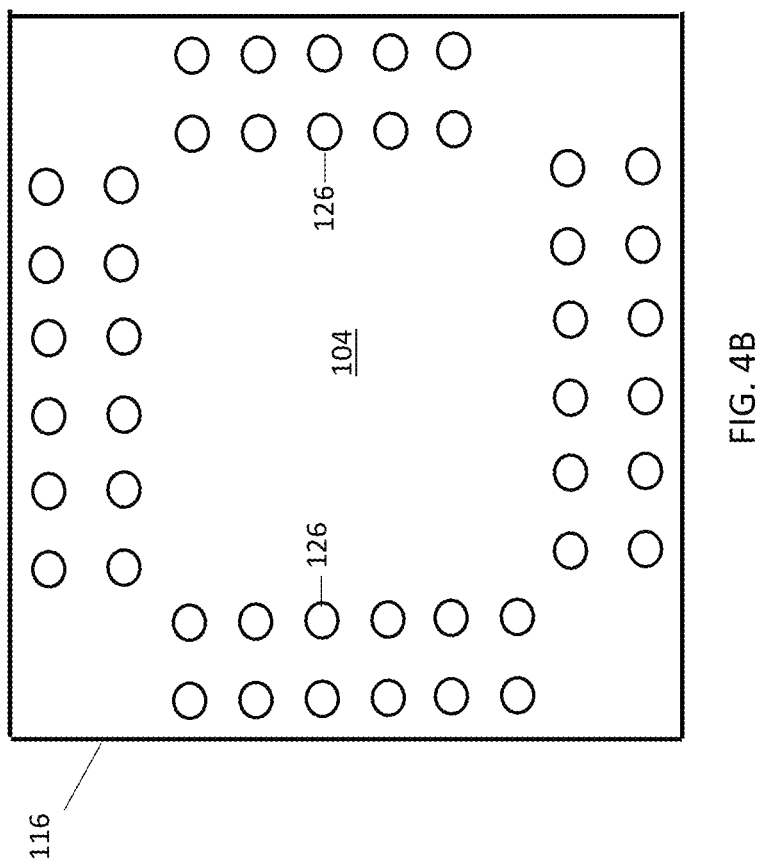
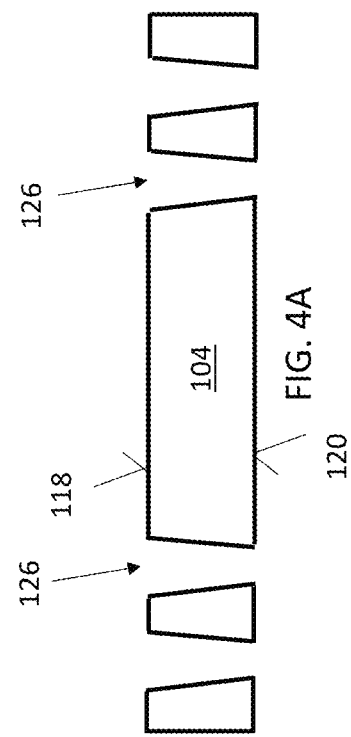
FIGURE 4

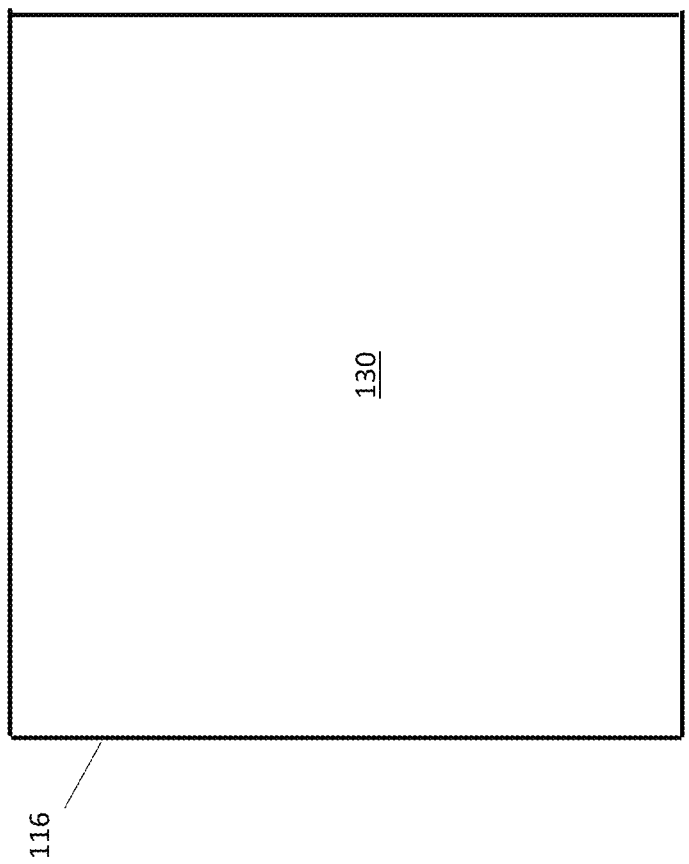
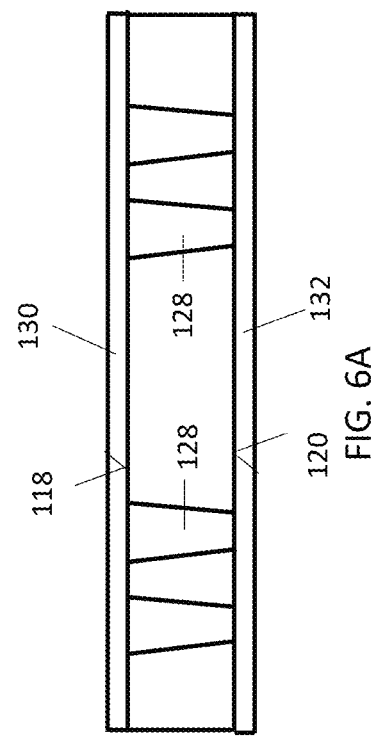
FIGURE 6

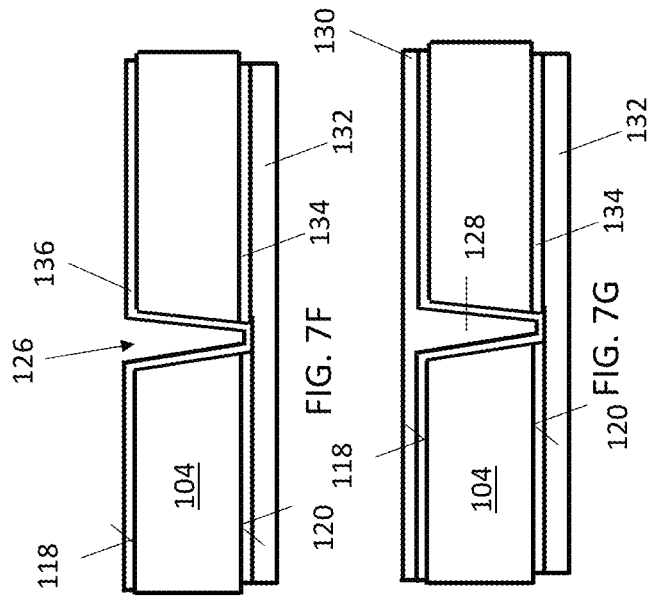
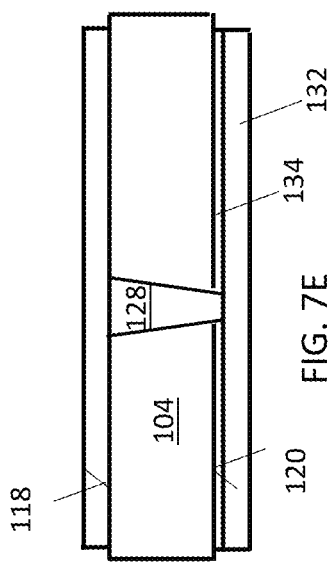
FIGURE 7

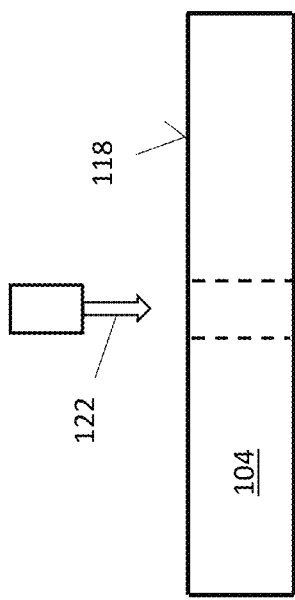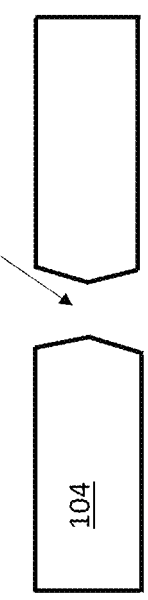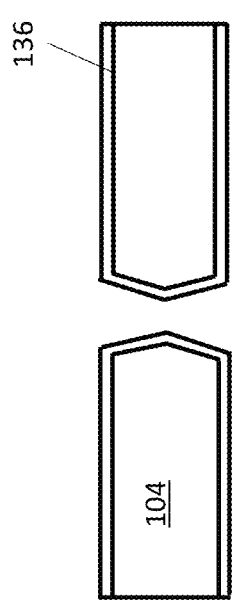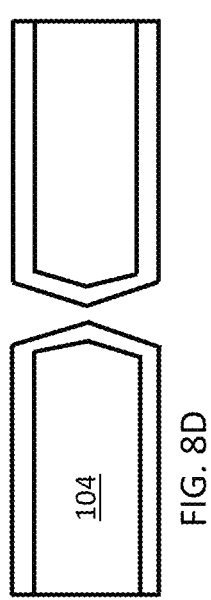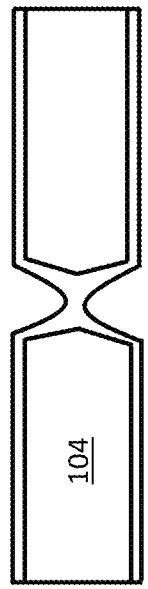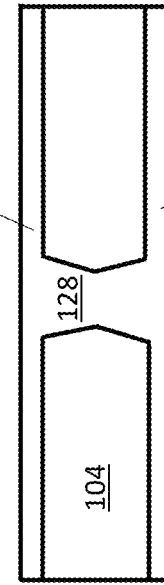
FIGURE 8

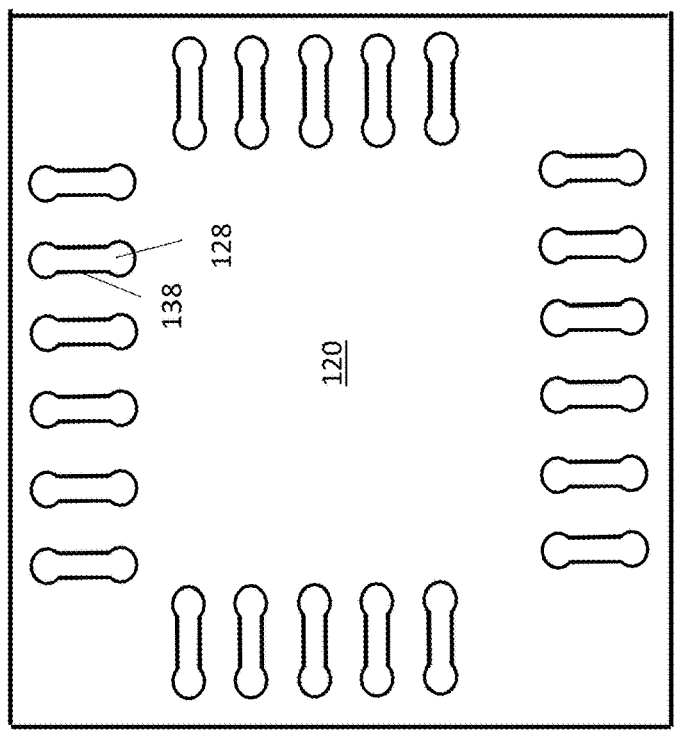
FIG. 9B
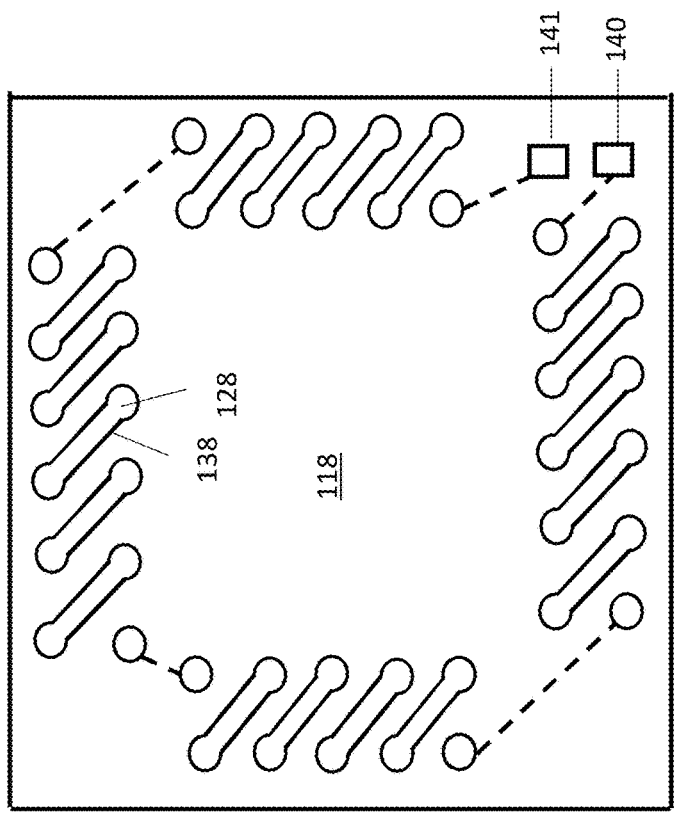
FIG. 9A
FIGURE 9

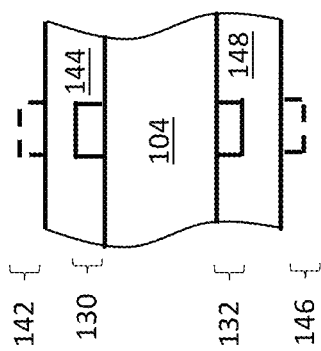
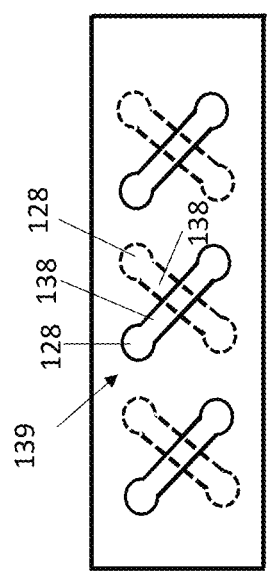
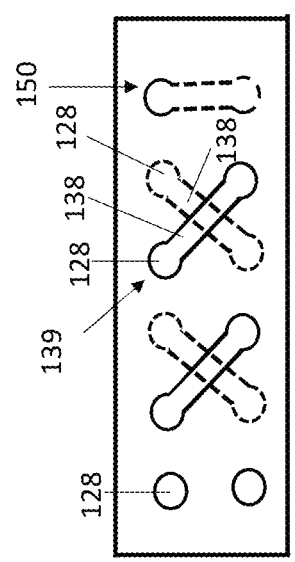
FIGURE 10

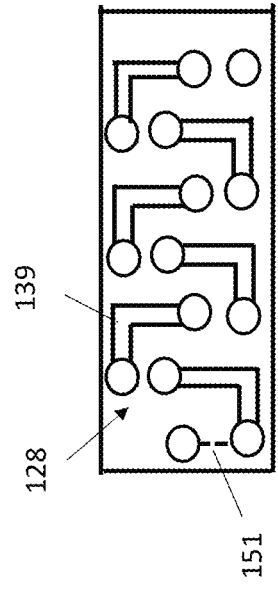
FIG. 10F
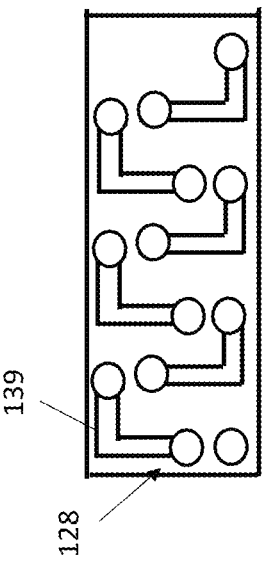
FIG. 10G
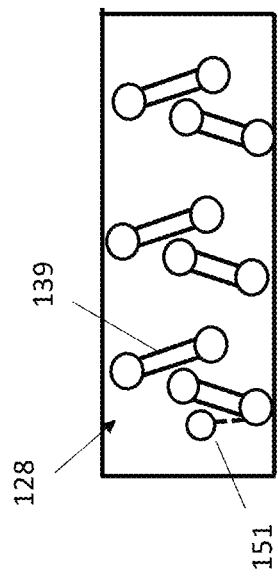
FIG. 10D
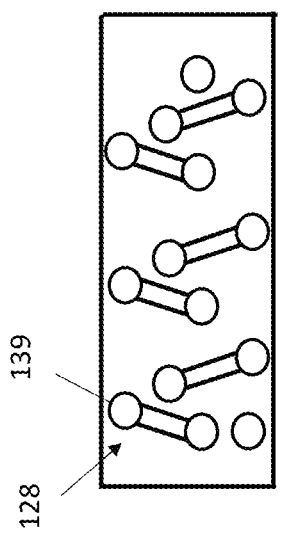
FIG. 10E
FIGURE 10

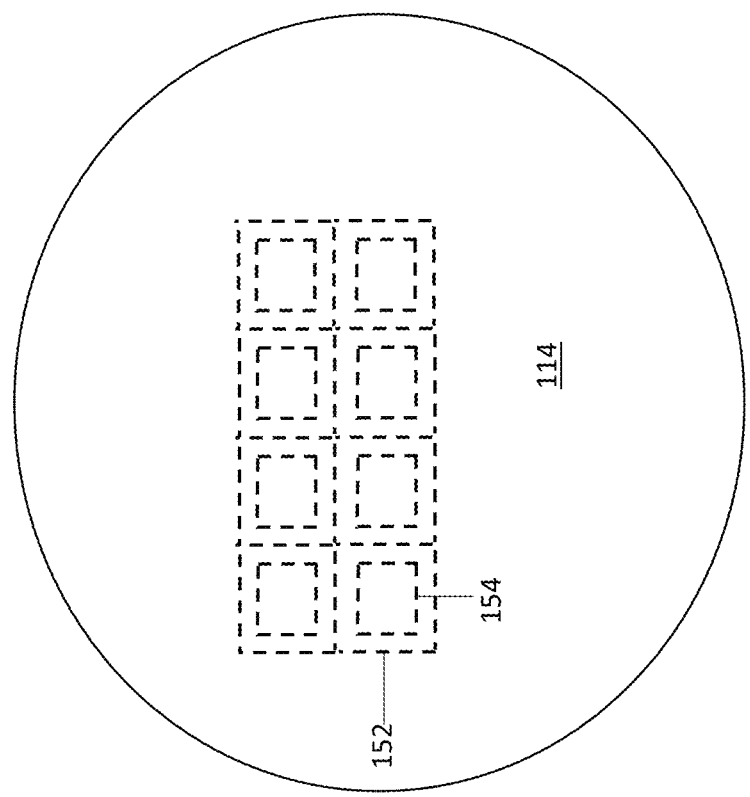
FIG. 11B
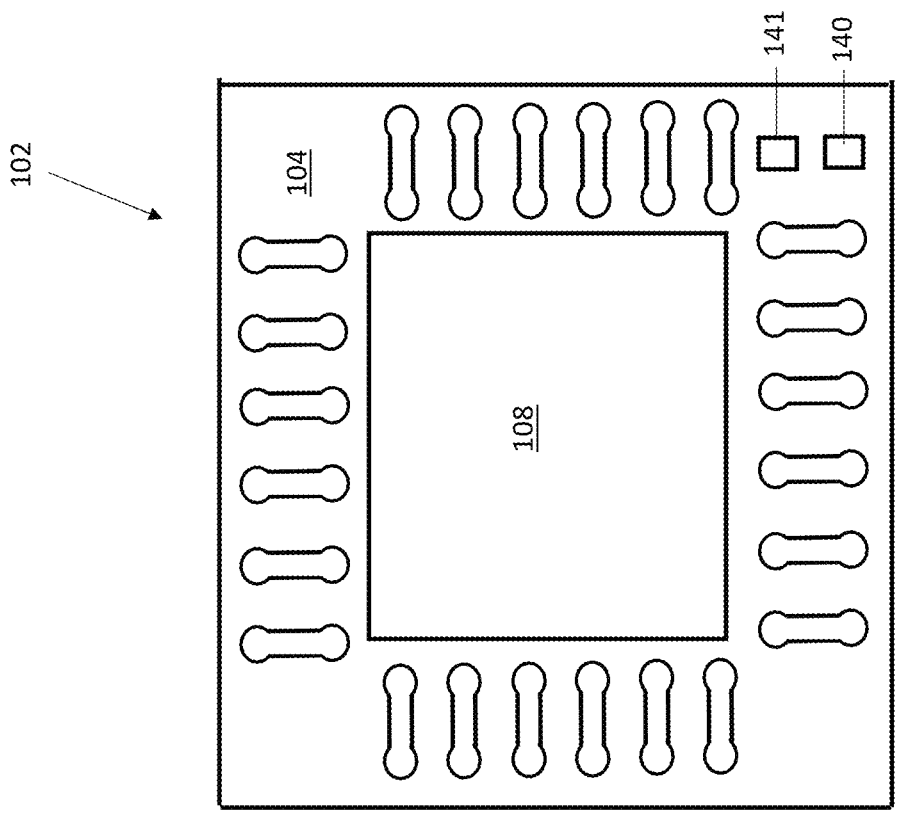
FIG. 11A
FIGURE 11

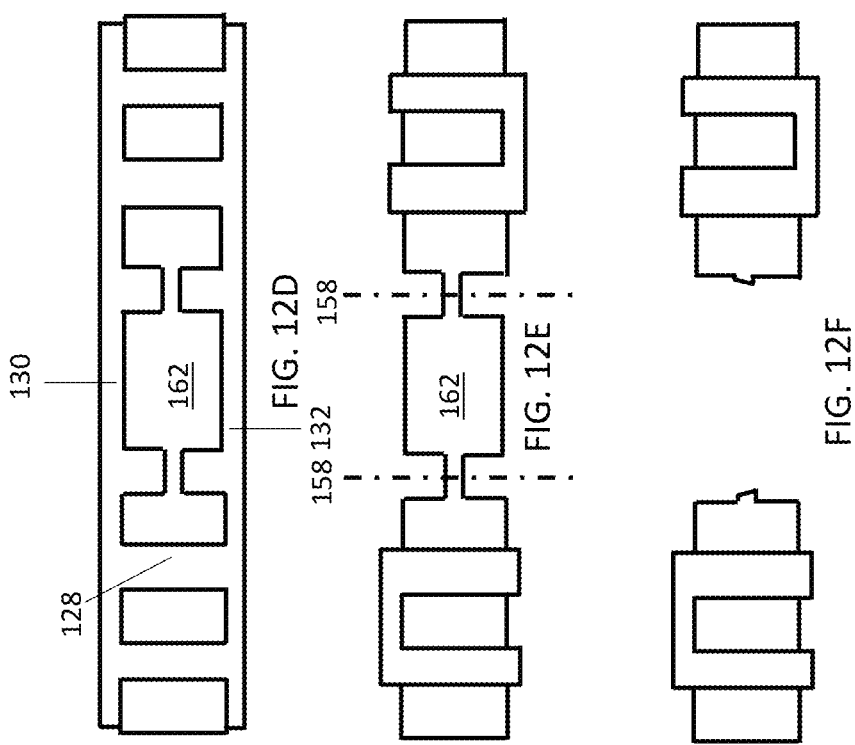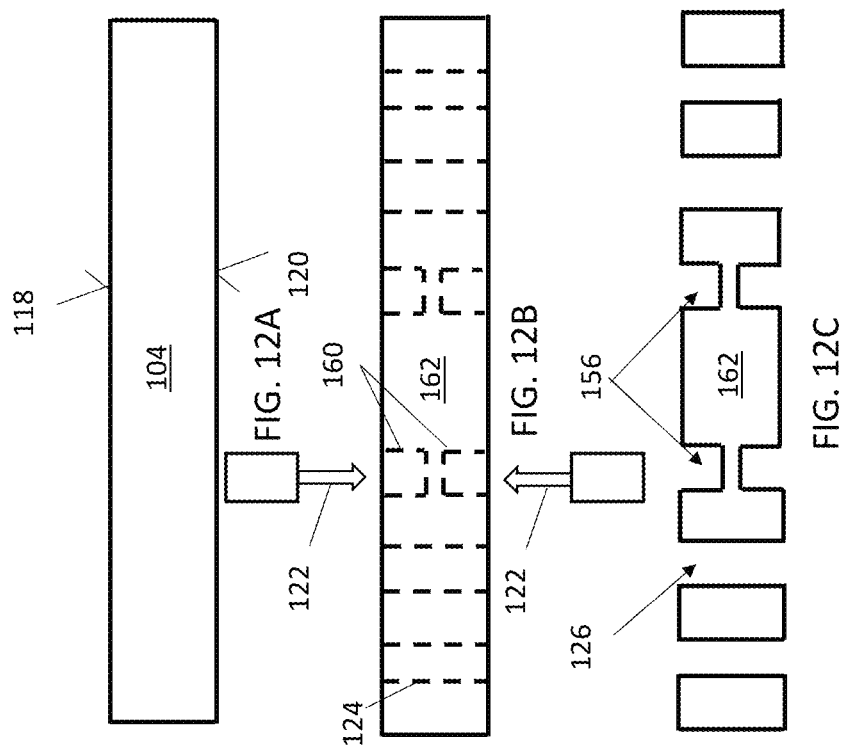
FIGURE 12

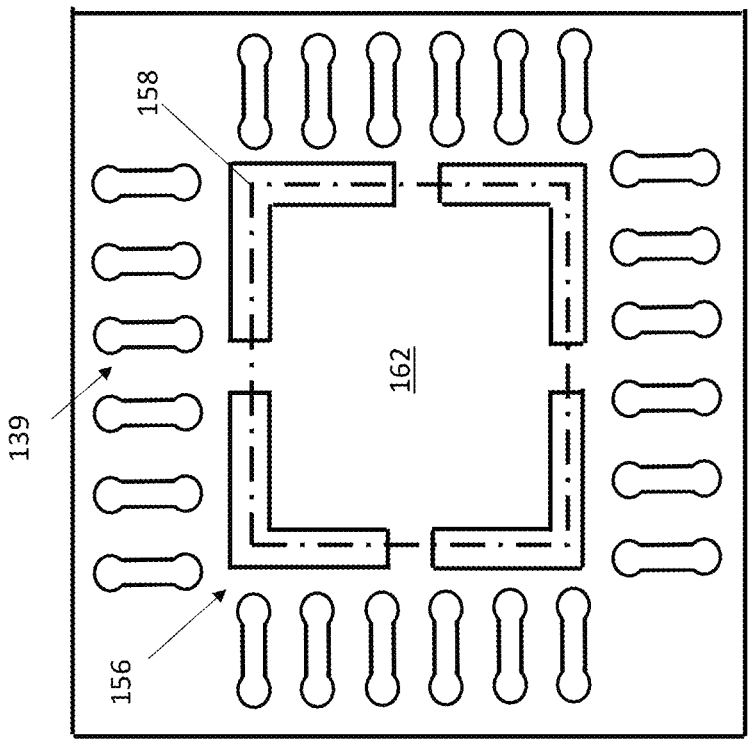
FIG. 15B
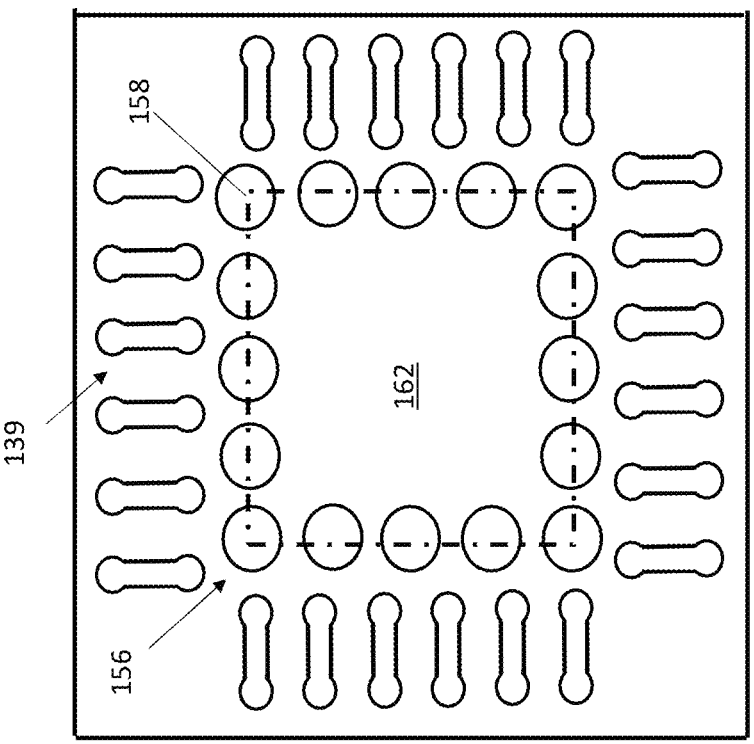
FIG. 15A
FIGURE 15

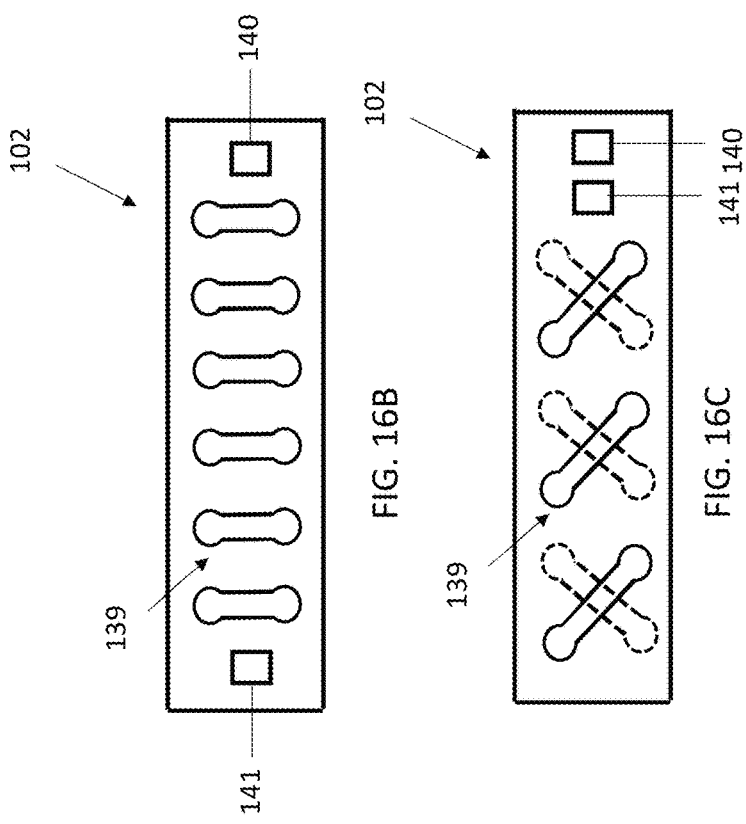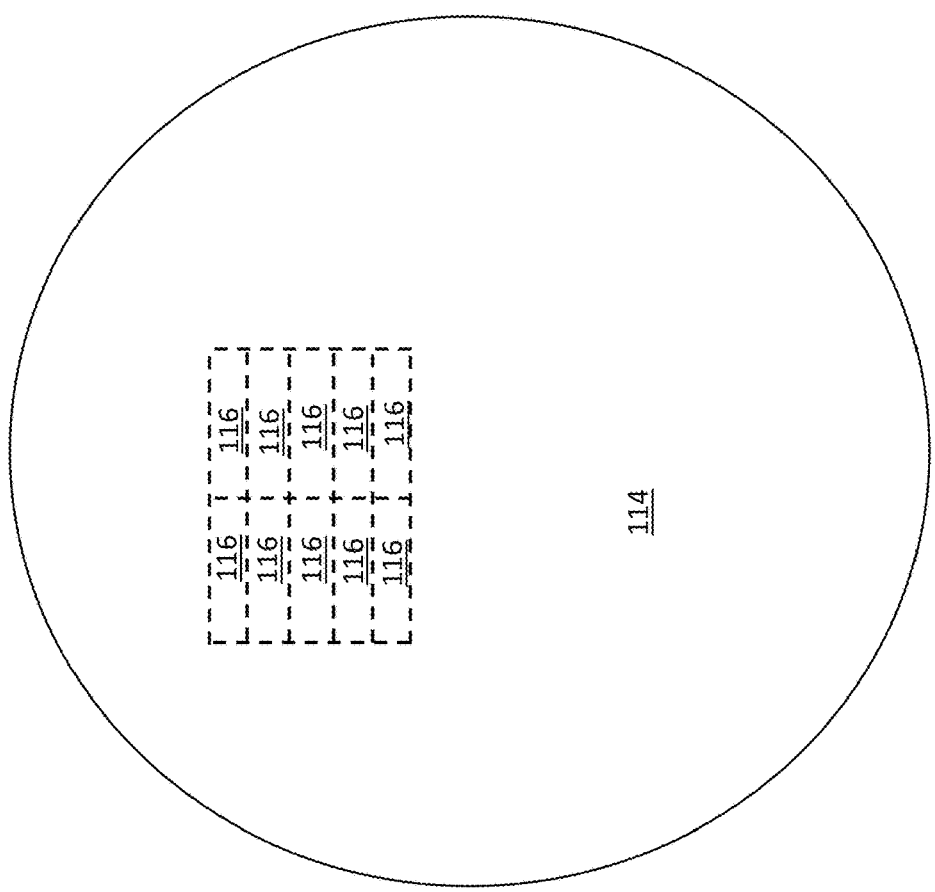
FIGURE 16

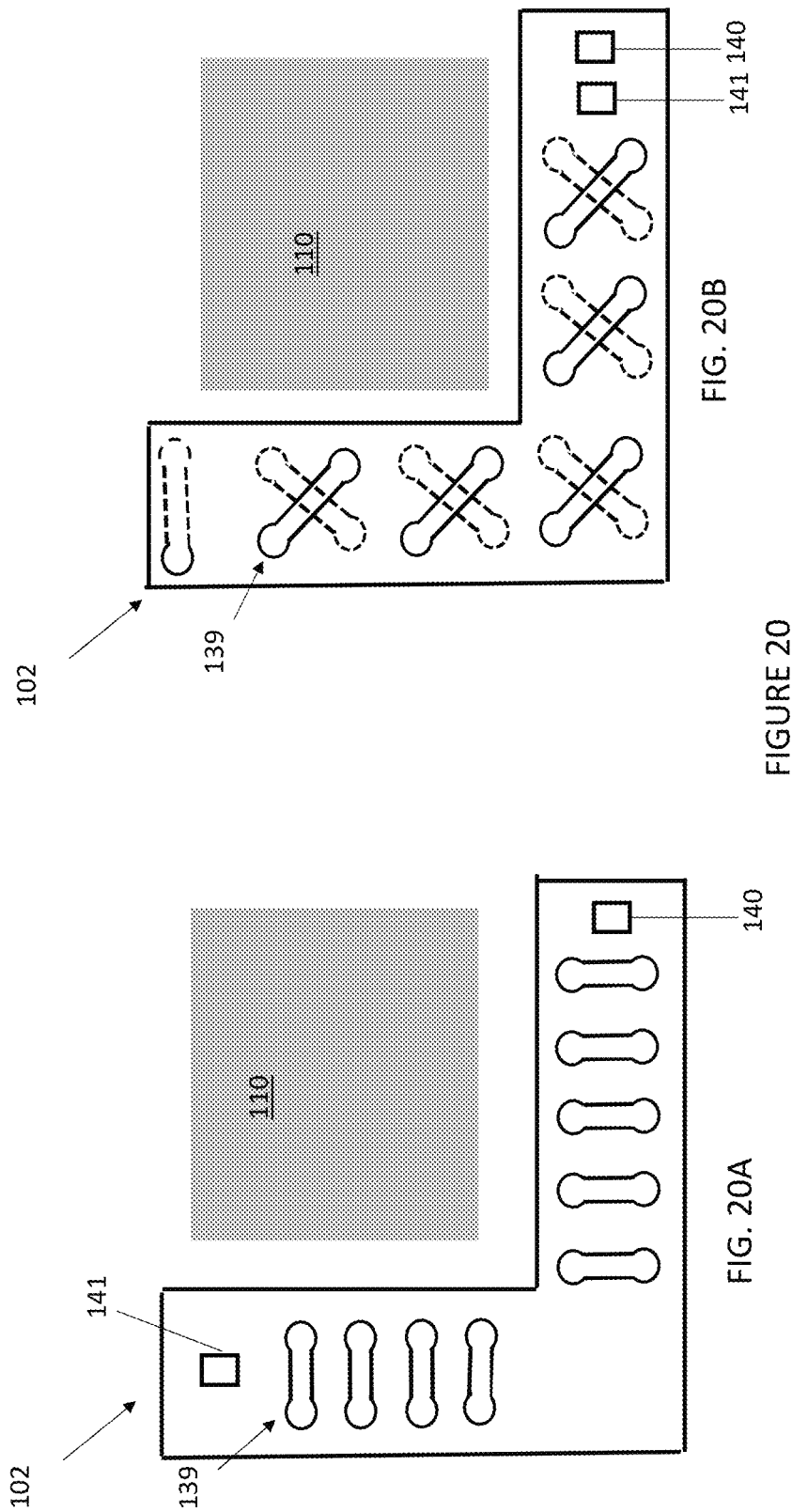

ROGOWSKI COIL INTEGRATED IN GLASS SUBSTRATE

BACKGROUND

Power semiconductor devices, e.g., diodes, MOSFETs (metal-oxide semiconductor field-effect transistor), IGBTs (insulated gate bipolar transistors), etc., are used in a wide variety of applications that involve large voltages (e.g., voltages above 100 volts, 250 volts, 500 volts, etc.) and/or large currents (e.g., currents above one ampere). One potential source of failure of the power semiconductor devices in these applications is a short circuit event that causes electrical and/or thermal destruction of the device. The device can be protected from a short circuit event if the event is detected early enough to disable the device before damaging voltage and and/or current is applied to the device. For IGBTs, there is typically a window of several microseconds to detect the short circuit and disable the device before the short circuit event destroys the device. Generally speaking, short circuit detection and protection measures should be reliable, fast, easy to integrate and inexpensive.

One way to implement short circuit detection involves configuring a driver circuit to detect an unexpected rise in the output voltage of the device (e.g., the collector-emitter voltage) due to the desaturation of the device in the event of a short circuit. One drawback of this technique is that it requires a comparatively long time to reliably differentiate between a short circuit current and an allowed overcurrent. Another way to implement short circuit detection involves providing a shunt arrangement. One drawback of this technique is that it does not accurately reflect the parameter of interest.

SUMMARY

A method of forming a current measurement device is disclosed. According to an embodiment, the method comprises providing a glass substrate comprising first and second substantially planar surfaces that are opposite one another, forming a plurality of through-vias in the glass substrate that each extend between the first and second substantially planar surfaces, and forming conductive tracks on the glass substrate that connect adjacent ones of the through-vias together. Forming the plurality of through-vias comprises applying radiation to the glass substrate, and the conductive tracks and the through-vias collectively form a coil structure in the glass substrate.

Separately or in combination, applying radiation to the glass substrate comprises applying laser energy to the first substantially planar surface to form a plurality of first laser-treated regions in the glass substrate, and etching each of the first laser-treated regions to form a plurality first laser-treated regions that extend between the first and second substantially planar surfaces, and the through-vias are formed in the perforations.

Separately or in combination, etching the laser-treated surfaces comprises applying an etchant to an unmasked region of the first substantially planar surface that comprises the first laser-treated regions and non-laser-treated regions, and the etchant has a greater etching rate to the first laser-treated regions than the non-laser-treated regions.

Separately or in combination, the first perforations are formed by applying the laser energy exclusively to the first substantially planar surface.

Separately or in combination, forming the through-vias comprises forming a second metallization layer on the second substantially planar surface before applying the laser energy to the first substantially planar surface, and performing a metal plating process that fills the first perforations with conductive metal.

Separately or in combination, the method further comprises forming a first metallization layer on the second substantially planar surface after applying the laser energy to the first substantially planar surface, and forming the conductive tracks comprises structuring each of the first and second metallization layers.

Separately or in combination, applying radiation to the glass substrate further comprises applying laser energy to the second substantially planar surface, and the laser energy applied to the second substantially planar surface substantially aligns with the first laser-treated regions.

Separately or in combination, forming the through-vias comprises forming a seed layer that lines sidewalls of the first perforations, and performing a metal plating process that uses the seed layer deposit conductive metal thereon.

Separately or in combination, the metal plating process is performed such that a first metallization layer forms on the first substantially planar surface and such that a second metallization layer forms on the second substantially planar surface, and forming the conductive tracks comprises structuring each of the first and second metallization layers.

In another embodiment, the method comprises providing a glass substrate comprising first and second substantially planar surfaces that are opposite one another, forming through-vias in the glass substrate that extend between the first and second substantially planar surfaces, forming a coil structure in the glass substrate that comprises a plurality of conductive windings, each of the conductive windings comprising a pair of the through-vias, forming a plurality of detachment features in the glass substrate, and separating a first section of the glass substrate by using the detachment features, and forming the through-vias and forming the detachment features by applying radiation to the glass substrate.

Separately or in combination, forming the through-vias and forming the detachment features comprises applying laser energy to the glass substrate to form a plurality of first laser-treated regions and a plurality of second laser-treated regions, etching each of the first laser-treated regions to form a plurality of first perforations in the glass substrate, and etching each of the second laser-treated regions to form a plurality of second perforations or one or more trenches in the glass substrate, the through-vias are formed in the plurality of first perforations, and the detachment features comprise the plurality of second perforations or one or more trenches.

Separately or in combination, the laser energy is applied such that the second laser-treated regions are formed with less laser energy than the first laser-treated regions, and etching each of the second laser-treated regions forms the detachment features to comprise the one or more trenches.

Separately or in combination, the one or more trenches are formed to comprise pairs of the trenches that are separated from one another by a thinner section of the glass substrate, and wherein the opposite facing pairs of the trenches define a separation plane in the glass substrate that surrounds the first section of the glass substrate.

Separately or in combination, the one or more trenches are formed to extend from the first substantially planar surface and are formed within the first section of the glass substrate.

Separately or in combination, the one or more trenches are formed to comprise a pair of the trenches that are separated from one another by a thicker section of the glass substrate that is part of the first section of the glass substrate.

Separately or in combination, separating the first section of the glass substrate comprises mechanically breaking a thinner portion of the glass substrate that is formed by the one or more trenches.

Separately or in combination, etching each of the second laser-treated regions forms the detachment features to comprise the plurality of second perforations, and the second perforations define a separation plane in the glass substrate that surrounds the first section of the glass substrate.

Separately or in combination, separating the first section of the glass substrate comprises breaking portions of the glass substrate that are between the second perforations.

Separately or in combination, the coil is disposed within the first section of the glass substrate.

Separately or in combination, the coil surrounds the first section of the glass substrate.

A current measurement device is disclosed. According to an embodiment, the current measurement device comprises a glass substrate comprising first and second substantially planar surfaces that are opposite one another, a plurality of through-vias in the glass substrate that each extend between the first and second substantially planar surfaces, and conductive tracks formed on the glass substrate that connect adjacent ones of the through-vias together, and the conductive tracks and the through-vias collectively form a coil structure in the glass substrate.

Separately or in combination, windings of the coil structure comprise a pair of the through-vias and one of the conductive tracks electrically connecting the pair of the through-vias together.

Separately or in combination, the current measurement device comprises a first metallization layer formed on the first substantially planar surface and a second metallization layer formed on the second substantially planar surface, and the conductive tracks are formed in the first and second metallization layers.

Separately or in combination, the conductive tracks that are formed in the first metallization layer have a first pattern, and wherein the conductive tracks that are formed in the second metallization layer have a second pattern that is different from the first pattern.

Separately or in combination, the current measurement device further comprises a third metallization layer that is formed over the first metallization layer and is insulated from the first metallization layer by a first interlayer dielectric, and a fourth metallization layer that is formed over the second metallization layer and is insulated from the second metallization layer by a second interlayer dielectric, and the conductive tracks are formed in the third and fourth metallization layers.

Separately or in combination, the coil structure is rewound such that the windings formed by the conductive tracks in the first and second metallization layers are interleaved with the windings formed by the conductive tracks in the third and fourth metallization layers.

Separately or in combination, the coil structure is configured as a Rogowski coil.

Separately or in combination, the glass substrate forms an enclosed loop around a central opening, and the coil at least partially surrounds the central opening.

Separately or in combination, the glass substrate has a linear bar-shaped geometry, and the coil structure extends linearly between opposite facing ends of the glass substrate.

Separately or in combination, the glass substrate has an L-shaped geometry with two perpendicular spans, and wherein the coil structure extends along both of the two perpendicular spans.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2, which includes FIGS. 2A and 2B, illustrates providing a glass substrate that is a unit section of a glass wafer, according to an embodiment. FIG. 2A illustrates a cross-sectional view of a unit section of the glass wafer, and FIG. 2B illustrates a plan-view of the glass wafer.

FIG. 3, which includes FIGS. 3A and 3B, illustrates performing a laser treatment to a glass substrate, according to an embodiment. FIG. 3A illustrates a cross-sectional view of the glass substrate during the laser treatment, and FIG. 3B illustrates a plan-view of the laser treatment pattern in the glass substrate.

FIG. 4, which includes FIGS. 4A and 4B, illustrates performing an etching process that forms perforations in the glass substrate from the laser-treated regions, according to an embodiment. FIG. 4A illustrates a cross-sectional view of the glass substrate after etching and FIG. 4B illustrates a plan-view of the unit section of the glass substrate.

FIGS. 5A and 5B, illustrates laser treatment and etching of the glass substrate, according to another embodiment. FIG. 5A illustrates a cross-sectional view of the glass substrate while performing a two-sided laser treatment, and FIG. 5B illustrates a cross-sectional view of the glass substrate after etching.

FIG. 6, which includes FIGS. 6A and 6B, illustrates forming through-vias in perforations and forming metallization layers on the glass substrate, according to an embodiment. FIG. 6A illustrates a cross-sectional view of the glass substrate, and FIG. 6B illustrates a plan-view of glass substrate.

FIGS. 7A-7G, illustrates selected steps for forming through-vias and metallization layers with a one-sided laser treatment process, according to an embodiment. Each figure shows a cross-sectional view of the glass substrate.

FIG. 8, which includes FIGS. 8A-8F, illustrates selected steps for forming through-vias and metallization layers with a two-sided laser treatment process, according to an embodiment. Each figure shows a cross-sectional view of the glass substrate.

FIGS. 9A-9C, illustrates structuring the metallization layers to form conductive tracks that connect adjacent through-vias, according to an embodiment. FIG. 9A illustrates a plan-view of the first substantially planar surface of the glass substrate, FIG. 9B illustrates a plan-view of the second substantially planar surface of the glass substrate, and FIG. 9C illustrates a cross-sectional view of the glass substrate.

FIG. 10, which includes FIGS. 10A-10F, illustrates structuring the metallization layers to form a rewound coil, according to an embodiment. FIG. 10A illustrates a plan-view of a top side of a two-layer coil, FIG. 10B illustrates a plan-view of a bottom side of a two-layer coil, FIG. 10C illustrates a cross-sectional view of the glass substrate with a two-layer coil, FIG. 10D illustrates a plan-view of a top side of a one-layer coil, FIG. 10E illustrates a plan-view of a bottom side of a one-layer coil, FIG. 10F illustrates a plan-view of a top side of a one-layer coil, FIG. 10G illustrates a plan-view of a bottom side of a one-layer coil.

FIG. 11, which includes FIGS. 11A-11B, illustrates separating the unit sections from the glass wafer, according to an embodiment. FIG. 11A illustrates a plan-view of a current measurement device formed by one of the unit sections, and FIG. 11B illustrates a plan-view of the glass wafer.

FIG. 12, which includes FIGS. 12A-12F, illustrates a technique for forming detachment features by a laser induced etching process and detaching a section of the glass substrate using the detachment features, according to an embodiment. Each figure shows a cross-sectional view of the glass substrate.

FIGS. 13A-13F, illustrates a technique for forming detachment features by a laser induced etching process and detaching a section of the glass substrate using the detachment features, according to another embodiment. Each figure shows a cross-sectional view of the glass substrate.

FIGS. 14A-14F, illustrates a technique for forming detachment features by a laser induced etching process and detaching a section of the glass substrate using the detachment features, according to another embodiment. Each figure shows a cross-sectional view of the glass substrate.

FIG. 15, which includes FIGS. 15A-15C, illustrates detachment features formed by a laser induced etching process, according to another embodiment. Each figure shows a plan-view of the glass substrate.

FIG. 16, which includes FIGS. 16A-16C, illustrates forming the coil in a unit section of the glass wafer which has a linear bar-shaped geometry, according to an embodiment. FIG. 16A depicts a plan-view of the glass wafer, FIG. 16B depicts a plan-view of a single wound coil provided in a linear bar-shaped section, and FIG. 16C depicts a plan-view of a rewound coil provided in a linear bar-shaped section.

FIGS. 17A and 17B, illustrates a measurement arrangement with a current measurement device that is provided in a linear bar-shaped glass substrate, according to an embodiment. FIG. 17A depicts a plan-view of the arrangement wherein the coil has a single wound configuration, and FIG. 17B depicts a plan-view of the arrangement wherein the coil has a rewound configuration.

FIGS. 18A and 18B, illustrates a measurement arrangement with a current measurement device that is provided in a linear bar-shaped glass substrate, according to another embodiment. FIG. 18A depicts a plan-view of the arrangement wherein multiple linear bar-shaped glass substrate portions with a single wound configuration are strung together, and FIG. 18B depicts a plan-view of the arrangement wherein multiple linear bar-shaped glass substrate portions with a rewound configuration are strung together.

FIGS. 19A-19C, illustrates forming the coil in a unit section of the glass wafer which has an L-shaped geometry, according to an embodiment. FIG. 19A depicts a plan-view of the glass wafer, FIG. 19B depicts a plan-view of a single wound coil provided in an L-shaped section, and FIG. 19C depicts a plan-view of a rewound coil provided in an L-shaped section.

FIG. 20, which includes FIGS. 20A and 20B, illustrates a measurement arrangement with a current measurement device provided in an L-shaped glass substrate, according to an embodiment. FIG. 20A depicts a plan-view of the arrangement wherein the coil has a single wound configuration, and FIG. 20B depicts a plan-view of the arrangement wherein the coil has a rewound configuration.

DETAILED DESCRIPTION

Embodiments of a current measurement device that includes a coil formed in a glass substrate are described herein. The windings of the coil are formed by through-vias that extend between opposite facing surfaces of the glass substrate and conductive tracks formed on the glass substrate that connect the through-vias together. The coil can be configured to measure the current of one or more devices (e.g., a semiconductor die) in the vicinity of the coil based upon an induced magnetic field generated in the device to be measured. This measurement is very accurate, as generates a signal that is representative of the actual current in the device. Moreover, the current measurement occurs very rapidly, e.g., within several nanoseconds of the current event, due to the low inductance of the Rogowski coil. Thus, the Rogowski coil provides an effective solution for detecting a short-circuit event and disabling a semiconductor device in sufficient time to avoid damage. More generally, the coil can be used in any application wherein an accurate and/or rapid current measurement is needed, e.g., current controlled systems.

The embodiments described herein include glass processing techniques for forming the Rogowski coil. These techniques are scalable, cost-effective, and highly precise. Glass provides a relatively inexpensive insulating substrate and has no negative influence on the function of the Rogowski coil. The through-vias can be formed by using a laser induced etching technique. This laser induced etching technique enables tight pitch formation of the through-vias, thereby enabling accurate current measurement through high density of windings in the coil structure. In embodiments, the laser induced etching technique can be used to form detachment features that are used to detach a section of the glass substrate or singulate a unit section of the glass wafer that includes the Rogowski coil.

Figure 1:
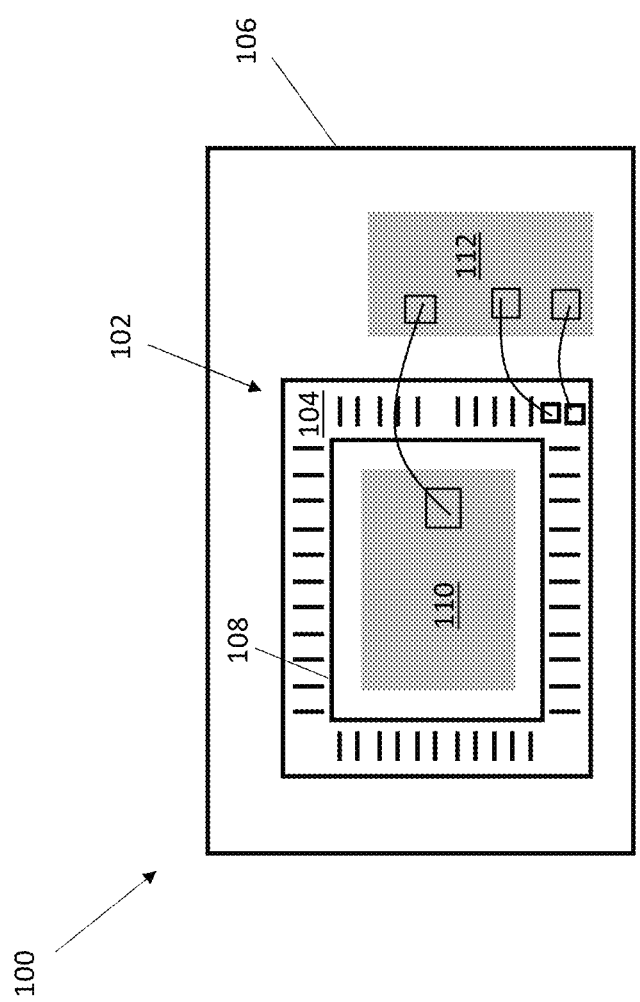
FIG. 1 illustrates an electronics assembly with current measurement device, according to an embodiment.

Referring to FIG. 1, an electronics assembly 100 that includes a current measurement device 102 is depicted. The current measurement device 102 comprises a coil that is formed in a glass substrate 104. The current measurement device 102 is mounted on a carrier structure 106. The carrier structure 106 can be any structure that is suitable for the mounting of semiconductor dies and/or passive components thereon. Examples of these carrier structures include a metal lead frame, a printed circuit board (PCB), or a power module substrate such as a DBC (direct bonded copper) substrate, an AMB (active metal brazed) substrate, or an insulated metal (IMS) substrate. The current measurement device 102 can be mounted on the carrier structure 106 by providing a glue or other adhesive between the glass substrate 104 and a bonding surface (e.g., metal bond pad or die attach surface) of the carrier structure 106.

According to an embodiment, the coil of the current measurement device 102 is configured as a Rogowski coil. A Rogowski coil consists of a helical coil of wire that extends continuously between two ends. The ends of the coil may or may not be disposed in the same location. In the depicted embodiment, the glass substrate 104 forms an enclosed loop around a central opening 108 and the coil is arranged in the glass substrate 104 to surround the central opening 108. More generally, the coil can be formed such that it at least partially surrounds the central opening 108.

The electronics assembly 100 includes a first semiconductor die 110 that generates the current to be measured by the current measurement device 102. Generally speaking, the first semiconductor die 110 can have any of a wide variety of device configurations. Examples of these device configurations include integrated circuits, discrete devices, active devices, passive devices, etc. In an embodiment, the first semiconductor die 110 is configured as a power transistor such as a MOSFET (metal-oxide semiconductor field-effect transistor) or IGBT (insulated gate bipolar transistor). As shown, the first semiconductor die 110 is disposed within the central opening 108 of the glass substrate 104 and mounted directly to the same bonding surface as the current measurement device 102. Instead of the single die as shown, the arrangement may include multiple semiconductor dies. In other embodiments, the first semiconductor die 110 can be mounted on a different surface. For instance, the current measurement device 102 can include a central glass portion (i.e., the central opening 108 is omitted) and the first semiconductor die 110 can be mounted thereon. In another example, a heat sink structure is mounted on the bonding surface within the central opening 108, and the first semiconductor die 110 can be mounted thereon. The first semiconductor die 110 can be mounted by a conductive or non-conductive material e.g., adhesive, solder, sinter, tape, etc.

The electronics assembly 100 further includes a second semiconductor die 112 that is mounted on the carrier structure 106. The second semiconductor die 112 is conductively connected to the current measurement device 102. As shown, these conductive connections are provided by bond wires. More generally, any type of electrical connection mechanism is possible. The second semiconductor die 112 may be a driver die that is configured to generate a control signal for turning the first semiconductor die 110 on or off (e.g., in the case of a transistor). Additionally, the second semiconductor die 112 may be configured to receive a signal from the current measurement device 102 and to determine a magnitude of a current rise in the first semiconductor die 110 based on this signal. The second semiconductor die 112 can be mounted by a conductive or non-conductive material, e.g., adhesive, solder, sinter, tape, etc. The second semiconductor die 112 can be mounted on the same bonding surface as the first semiconductor die 110 or alternatively may be mounted on a bond pad that is electrically isolated from the first semiconductor die 110.

The working principle of the current measurement device 102 is as follows. When the first semiconductor die 110 experiences a rapid change in current, it generates a rapid change of the magnetic field. The current measurement device 102 is located sufficiently close to this magnetic field such that a voltage is induced in the coil structure. This voltage is fed to the second semiconductor die 112 via the conductive connection. The magnitude of the voltage induced in the coil is proportional to the rate of change of current (di/dt). The second semiconductor die 112 includes integration circuitry that integrates the induced coil voltage to determine the magnitude of the current in the first semiconductor die 110. The second semiconductor die 112 uses this information to protect the first semiconductor die 110 from the short circuit event. For instance, the second semiconductor die 112 can compare the determined current value against a predefined threshold which indicates a short circuit condition. In the event that the current measurement exceeds this predefined threshold, the driver portion of the second semiconductor die 112 may turn off or otherwise disable all elements in the first semiconductor die 110 via the conductive connection between the first and second semiconductor dies 110, 112. The illustrated configuration represents just one potential arrangement that utilizes this concept. In another example, some or all of the functions of the second semiconductor die 112 are implemented in a device that is outside of the electronics assembly 100, e.g., in a device provided on a separate PCB. In another example, the current measurement device 102 can be used to measure the current of a variety of different elements or device configurations such as coil elements, parallel dies, current pins, terminals, bond wires, etc.

Advantageously, because the current measurement device 102 is configured as a stand-alone component that can be mounted on the same carrier structure 106 as the device to be measured (the first semiconductor die 110 in the depicted example), it can easily be integrated into a packaged semiconductor device or power module. As a result, parasitic effects (e.g., stray inductance) of the short circuit protection mechanism are minimized.

Referring to FIG. 2, a method for forming the current measurement device 102 includes providing a glass wafer 114. Generally speaking, the glass wafer 114 may include any amorphous (non-crystalline) solid glass material. Examples of these glass materials include quartz glass, silica glass, soda lime glass, photostructurable glasses (e.g., foturan), float glass, porcelains, polymer thermoplastics, polymer glasses, acrylic glass, polycarbonate, polyethylene terephthalate, etc. In an embodiment, the glass wafer 114 includes ferroelectric materials, e.g., Fe, Co, Ni, or ferromagnetic glasses, which increase the permeability of the material thus improve the signal level of the Rogowski coil.

Each of the processing steps to be described below are performed in a single unit section 116 of the glass wafer 114. Thus, multiple identical ones of the current measurement device 102 can be formed from a single glass wafer 114. Each unit section 116 provides a glass substrate 104 with first and second substantially planar surfaces 118, 120 that are opposite one another. A thickness of the glass substrate 104 as measured between these first and second substantially planar surfaces 118, 120 can generally be in the range of 100 µm-10 mm, for example, and can be in the range of 200-500 µm in exemplary embodiments. Generally speaking, the glass substrate 104 can be of any shape different from the depicted round wafer, e.g., rectangular, ellipsoid, polygonal, etc.

Referring to FIG. 3, the method further includes applying laser energy 122 (i.e., highly concentrated electromagnetic radiation) to the first substantially planar surface 118 of the glass substrate 104. In an embodiment, the laser energy 122 is applied with a standard microelectronics laser tool such as an excimer laser, which applies UV radiation with a wavelength of 308 nm. More generally, the laser energy 122 can be in the UV or visible light spectrum. The laser energy 122 can be applied in multiple short bursts e.g., between about 100 ns (nanoseconds) and 200 ns or as a continuous pulse. The laser energy 122 forms a plurality of first laser-treated regions 124 in the glass substrate 104. The first laser-treated regions 124 are portions of the glass substrate 104 wherein the molecular structure of the glass material has been disorganized by the laser energy 122, and consequently these regions are more susceptible to etching than non-laser-treated regions.

Referring to FIG. 4, the method further includes an etching process. The etching process etches each of the first laser-treated regions 124 to form a plurality of first perforations 126 that extend between the first and second substantially planar surfaces 118, 120. Moreover, non-laser-treated regions (i.e., portions of the glass substrate 104 adjacent to the first laser-treated regions 124) of the substrate remain substantially intact. Generally speaking, the etchant used to etch the first laser-treated regions 124 can be any etchant capable of etching glass material. In specific embodiments, the etchant can include a wet chemical (e.g., fluor/fluorine containing or based) etchant, such as e.g. HF (hydrofluoric acid).

According to an embodiment, the etching process is a performed using a mask-less technique. According to this technique, an unmasked region of the first substantially planar surface 118 that comprises the first laser-treated regions 124 and non-laser-treated regions is exposed to the etchant. The etchant has a greater etch rate to glass material damaged by the laser treatment such that the first laser-treated regions 124 are removed at a faster rate than the non-laser-treated regions. Generally speaking, the selectivity of the etchant can be anywhere between 5:1 and 100:1, meaning that the etchant removes the first laser-treated regions 124 anywhere between 5 times to 100 times faster than it removes the non-laser-treated regions. The selectivity of the etchant can depend on a variety of factors, e.g., applied laser energy 122, glass type, etchant type, etc. In one particular example wherein the glass substrate 104 includes quartz material and the etchant includes HF, the selectivity of the etchant is between about 40:1 and 60:1. Because the mask-less technique nevertheless removes some material from the non-laser-treated regions, the thickness of the glass substrate 104 slightly reduces in accordance with the selectivity of the etchant during the etching process. For example, assuming a glass substrate 104 with an initial thickness of 500 µm and an etchant with a selectivity of 10:1 as between the first laser-treated regions 124 and the non-laser-treated regions, the thickness of the glass substrate 104 reduced to about 450 µm after performing the etching process. Thus, the initial thickness of the glass substrate 104 can be selected to account for this thickness reduction so that the windings of the completed Rogowski coil have a desired height. In another embodiment, a mask is used to protect the untreated regions of the glass substrate 104.

The first perforations 126 formed by the etching process can be least slightly tapered, meaning that the width of the first perforations 126 gradually decreases moving away from the surface that is exposed to the laser treatment (the first substantially planar surface 118 in the depicted example). This taper results from the fact that the laser treatment becomes less effective moving deeper into the glass substrate 104. Thus, the etchant becomes slightly less effective as it reaches deeper portions of the first laser-treated regions 124. The degree of taper, i.e., the angle of the sidewalls relative to perpendicular with the first substantially planar surface 118, can be controlled by tailoring process parameters such as amount of laser energy 122, type of glass material, type of etchant material, etc. Generally speaking, the taper may rage from between 0.1° and 30°.

Figure 5:
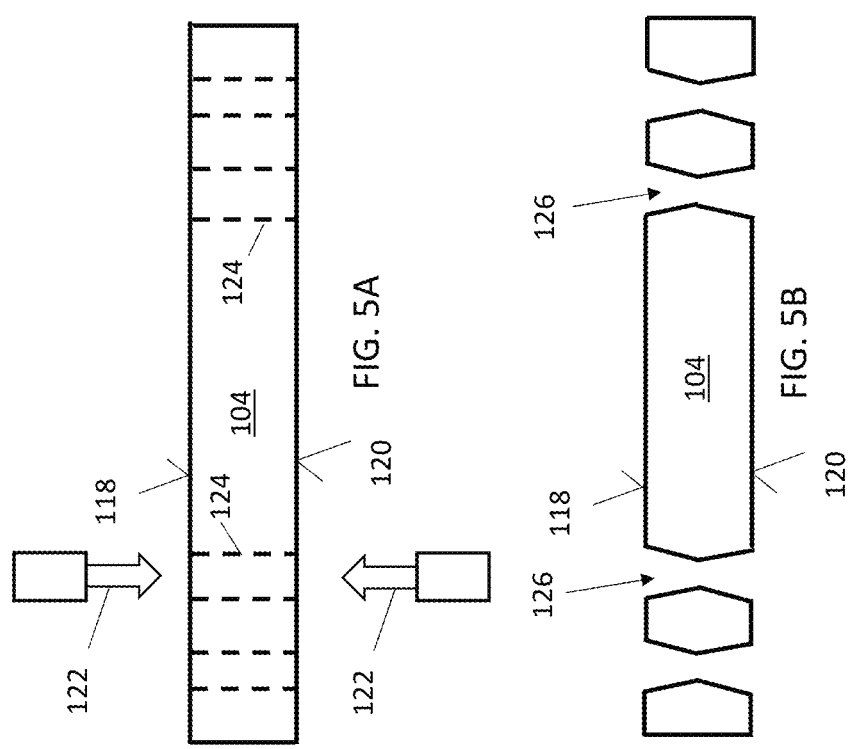
FIG. 5, which includes

Referring to FIG. 5, an alternate laser induced etching technique is shown. In the previously described technique, the first perforations 126 are formed by applying the laser energy 122 exclusively to the first substantially planar surface 118, meaning that no laser energy 122 is applied to the second substantially planar surface 120 before performing the etching process. By contrast, the laser induced etching technique of FIG. 5 is a multi-side technique that further comprises applying laser energy 122 to the second substantially planar surface 120. The laser energy 122 that is applied to the second substantially planar surface 120 is aligned with the laser energy 122 that is applied to the first substantially planar surface 118 so that the first laser-treated regions 124 are energized at both sides of the glass substrate 104. Optionally, the laser energy 122 applied at the second substantially planar surface 120 may be identical to the laser energy 122 applied at the first substantially planar surface 118.

The multi-side technique of FIG. 5 may be particularly beneficial to thicker glass substrates 104 wherein it is difficult or impossible for the laser energy 122 to sufficiently penetrate the glass substrate 104 from one side. As mentioned above, the applied laser energy 122 tends to be less effective at modifying the molecular structure of the material moving further into the substrate. The two-sided technique overcomes this issue by providing more thorough penetration of the laser energy 122. The two-sided technique of FIG. 5 may generally be preferable to glass substrates 104 with a thickness of at least thickness 500 µm, for example. As can be seen from FIG. 5B, the multi-side laser activation results in symmetric tapering of the first perforations 126 such that the first perforations 126 have an hourglass-like shape. Depending on the sequence of steps, laser energy and etchant used, other shapes are possible.

The techniques described with reference to FIGS. 3, 4 and 5 illustrate just two examples of a technique for forming the perforations 124 in the glass substrate 104 by a radiation-based process. More generally, the perforations 124 can be formed by any technique wherein the glass properties of the glass substrate 104 is modified by exposure to UV (ultraviolet) light (e.g., in the cause of foturan material) or a laser radiation source, and subsequently etched. In any of these techniques, the UV (ultraviolet) light or laser radiation modifies the properties of the glass substrate 104 such that the treated regions can be etched faster than the non-treated regions.

Referring to FIG. 6, the method further includes forming a plurality of through-vias 128 in the glass substrate 104 and forming first and second metallization layers 130, 132 on the glass substrate 104. The through-vias 128 are formed in the first perforations 126 and extend between the first and second substantially planar surfaces 118, 120. The first metallization layer 130 is formed on the first substantially planar surface 118 and the second metallization layer 132 is formed on the second substantially planar surface 120. The through-vias 128 and the first and second metallization layers 130, 132 may include a conductive metal, e.g., copper, aluminium, nickel, etc. One or both of the first and second metallization layers 130, 132 can be initially formed as blanket layers, meaning that they cover an entire area of the first and/or second substantially planar surfaces 118, 120. Generally speaking, these metallization layers can be formed by any of a variety of metal deposition techniques, e.g., metal plating such as electroplating or electroless plating, physical vapour deposition, chemical vapour deposition, etc., or more generally by means of chemical, physical, plasma assisted, printing, erosion deposition. More specific examples of techniques for forming these structures will be provided in further detail below.

Figure 7:
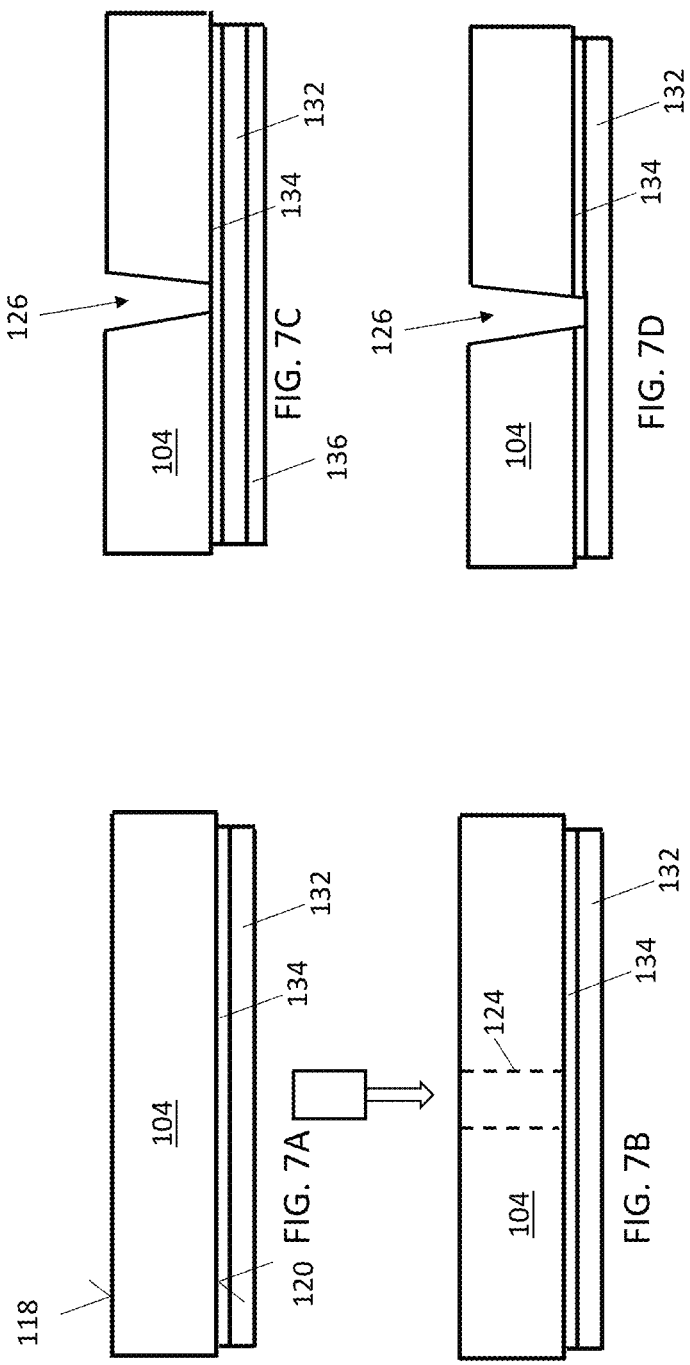
FIG. 7, which includes

Referring to FIG. 7, a technique for forming the through-vias 128 and the first and second metallization layers 130, 132 in combination with a one-sided laser etching technique (e.g., the technique described with reference to FIGS. 3-4) is depicted. According to this technique, the second metallization layer 132 is formed on the second substantially planar surface 120 before applying the laser energy 122 to the first substantially planar surface 118. A thin layer 134 of metal may be formed between the second metallization layer 132 and the second substantially planar surface 120. The thin layer 134 should have good adhesion to glass and be sufficiently thick to act as an etchant barrier. Exemplary materials for the thin layer 134 include Cr, Ti and Ag. The second metallization layer 132 may be relatively thicker and may be formed from a different material that is an effective seed material (e.g., Cu) as the thin layer 134 of metal. Subsequently as shown in FIG. 7B, the laser energy 122 is applied to the first substantially planar surface 118. The thin layer of metal 134 protects the second metallization layer 132 from being damaged during this step. Subsequently as shown in FIG. 7C, an etching process is performed so that the first perforations 126 completely penetrate the glass substrate 104. At this time, a layer of etch resistant material 136 may be formed to cover the second metallization layer 132 so that it does not become etched or damaged by the etchant. Subsequently as shown in FIG. 7D, the portion of the thin layer of metal 134 that is exposed at the bottom of the first perforations 126 is etched by a different etchant so as to expose the second metallization layer 132.

Referring to FIG. 7E, a first option for forming the through-via 128 is depicted. According to this technique, after removing the portion of the thin layer of metal 134, a metal plating process is performed. This metal plating process may include a electro- and/or electroless plating process wherein the deposited metal grows successively from the bottom of the first perforations 126 until the first perforations 126 are filled with a conductive metal (e.g., Cu). A seed layer may be provided on the sidewalls and lower surface of the through-via. Subsequently, the first metallization layer 130 is formed on the first substantially planar surface 118. This may be done by physical vapour deposition and galvanic thickening.

Referring to FIGS. 7F-7G, a second option for forming the through-via 128 is depicted. According to this technique, after removing the portion of the thin layer of metal 134, a metal seed layer 136 is deposited on the glass substrate 104, e.g., by a physical vapour deposition technique. The seed layer 136 lines the sidewalls of the first perforations 126 and covers the first substantially planar surface 118. Subsequently, a plating process is performed (e.g., electroless or electroplating) to deposit conductive metal on the seed layer 136. The plating process fills the first perforations 126 with conductive metal (e.g., Cu). The same plating process can form the first metallization layer 130. In comparison to the technique of FIG. 7E, this technique may enhance the speed for forming the through-via 128 structures and/or reduce the possibility of defects forming in the through-via 128 structures. Instead of or in combination with the plating techniques described above, the through-via 128 structures can be at least partially formed by depositing filler materials such as copper spheres in the openings.

Referring to FIG. 8, a technique for forming the through-vias 128 and the first and second metallization layers 130, 132 in combination with a multi-sided laser etching technique (e.g., the technique described with reference to FIG. 5) is depicted. According to this technique, after forming the first laser-treated regions 124 and etching the glass substrate 104 as shown in FIGS. 8A and 8B, a seed layer 136 is formed which lines the sidewalls of the first perforations 126 and the first and second substantially planar surfaces 118, 120. Generally speaking, the seed layer 136 can include any conductive metal, e.g., copper, nickel, silver, etc. The seed layer 136 can be formed by a physical vapour deposition technique, for example. Subsequently, a metal plating process that uses the seed layer 136 to deposit conductive metal thereon is performed. The metal plating process can be an electroless or electroplating process, for example. The metal plating process successively deposits conductive metal (e.g., Cu) on the seed layer until the first perforations 126 are filled with the conductive metal. The process can be performed such that the first perforations 126 fill in each dimension (including a dimension perpendicular to the depicted cross-sectional view) so that the first perforations 126 become completely filled. The first and second metallization layers 130, 132 are simultaneously formed during this deposition step.

Figure 9:
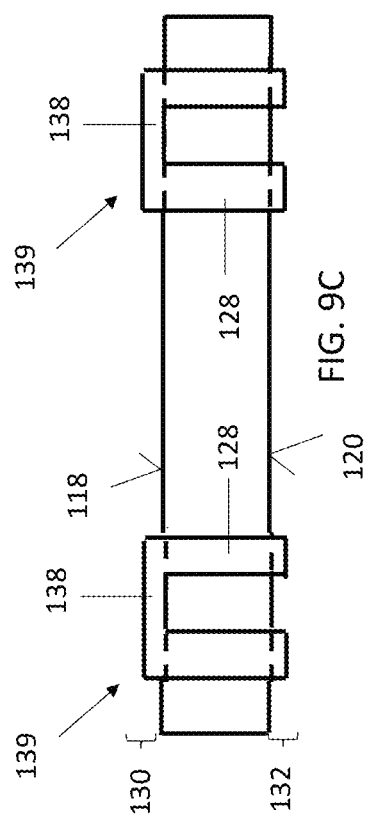
FIG. 9, which includes

Referring to FIG. 9, the method further includes structuring the first and second metallization layers 130, 132. This metal structuring step selectively removes portions of the first and second metallization layers 130, 132 to form conductive tracks 138 on the first and second substantially planar surfaces 118, 120 of the glass substrate 104. The metal structuring can be done by forming a mask on the first and second metallization layers 130, 132 (e.g., using photolithography techniques) and subsequently etching the metal exposed from the mask, e.g., using an etching or ablation technique.

The conductive tracks 138 connect adjacent ones of the through-vias 128 together to form the windings 139 of the coil structure. As can be appreciated from the top-side and bottom-side views of FIGS. 9A and 9B, respectively, the conductive tracks 138 in the first metallization layer 130 have a different pattern than the conductive tracks 138 in the second metallization layer 132. More particularly, as can be seen in FIG. 9A, the conductive tracks 138 have a diagonal pattern that connects two through-vias 128 that are diagonally adjacent one another together. As can be seen in FIG. 9B, the conductive tracks 138 have a perpendicularly aligned pattern that connects two through-vias 128 that are immediately adjacent one another in either the vertical or the horizontal direction together. This pattern produces a coil structure wherein a first one of the through-vias 128 is electrically connected to a second one of the through-vias 128, the second one of the through-vias 128 is electrically connected to a third one of the through-vias 128, and so forth.

The illustrated patterns represent just one potential configuration which produces a coil structure. More generally, the orientation of the through-vias 128 and patterning of the first and second metallization layers 130, 132 can have any geometry that produces a number of windings 139 in the glass substrate 104. In FIG. 9A, certain ones of the electrical connections between the through-vias 128 are schematically represented with dashed lines. These electrical connections can be provided by conductive tracks 138 in a similar manner. In practice, the through-vias 128 and conductive tracks 138 may be arranged to form a coil structure that continuously wraps around the central portion of the glass substrate 104, with little or no difference in the size or separation distance of each winding.

The first and second metallization layers 130, 132 are additionally structured to include first and second bond pads 140, 141. In the depicted embodiment, the first and second bond pads 140, 141 are formed in the first metallization layer 130. The first and second bond pads 140, 141 provide externally accessible points of electrical contact to the ends of the coil structure.

After structuring the first and second metallization layers 130, 132, passivation and/or insulation layers may be formed on the glass substrate 104. These layers may be configured to provide electrical isolation and to protect the coil structure. These layers may include oxides, imides, insulating foils, dip insulation, epoxy, glass, etc. In addition or in the alternative, the conductive tracks 138 can be provided within recesses formed in the first and/or second substantially planar surfaces 118, 120. In that case, the glass substrate 104 itself provides electrical isolation and a further insulation material can be formed on top of the conductive tracks 138 or within the openings, e.g., by stencil printing, screen printing, spray coating, etc.

Referring to FIG. 10, the glass substrate 104 may be further processed to include a third metallization layer 142 that is formed over the first metallization layer 130 and is insulated from the first metallization layer 130 by a first interlayer dielectric 144, and a fourth metallization layer 146 that is formed over the second metallization layer 132 and is insulated from the second metallization layer 132 by a second interlayer dielectric 148. The first and second interlayer dielectrics 144, 148 may be or include an oxide, imide, epoxy, glass, etc. The third and fourth metallization layers 142, 146 may be formed using similar or identical techniques as the first and second metallization layers 130, 132. The third and fourth metallization layers 142, 146 are structured to include conductive tracks 138 in a similar manner as previously described.

In the embodiment of FIG. 10, the coil has a rewound configuration wherein the windings 139 continuously extend from a starting point of the coil to an outer end 150 of the coil and then double back to the starting point. At the outer end 150 of the coil, a connection between the first and second metallization layers 130, 132 is provided.

In the embodiment of FIGS. 10A-10C, the windings 139 formed by the conductive tracks 138 in the first and second metallization layers 130, 132 are interleaved with the windings 139 formed by the conductive tracks 138 in the third and fourth metallization layers 142, 146. While the figures illustrate a simple case of a rewound coil that extends linearly through a portion of the glass substrate 104, the rewound coil can be formed in any desired geometry, including the enclosed loop geometry that is depicted in FIG. 9.

FIGS. 10D and 10E illustrate one embodiment of a rewound configuration that is obtained with only one layer of metallization on each side of the glass substrate 104. FIGS. 10E and 10F illustrate another embodiment of a rewound configuration that is obtained with only one layer of metallization on each side of the glass substrate 104. In each of these examples, the first and second metallization layers 130, 132 are patterned in such a way that allows for the coil to double back. An electrical connection 151 is provided between two of the through-vias 128 to enable rewinding.

One advantage of a Rogowski coil with a rewound configuration is reduced parasitic effects in comparison to the previously described single wound configuration wherein the windings 139 do not double back across the coil structure. This is at least partially attributable to the fact that the rewound configuration eliminates a closed conductor loop into which voltage can additionally be induced by parasitic magnetic fields.

Referring to FIG. 11, after forming the coil structure (either the single wound configuration or the rewound configuration), each unit section 116 is singulated from the glass wafer 114. The glass wafer 114 is singulated along outer cut lines 152 which define an outer periphery of each current measurement device 102. Additionally, the glass substrate 104 is singulated along inner cut lines 154 which form the central opening 108 of the current measurement device 102. Generally speaking, the singulation along either cut line may be performed using any glass cutting technique, e.g., laser ablation, mechanical sawing, chemical etching, etc. In an embodiment, at least some of these singulation steps are performed a laser etching technique, which may be the same technique used to form the through-via structures, examples of which will be described in further detail below.

Referring to FIGS. 12-15, various techniques for forming detachment features 156 in the glass substrate 104 are depicted. The detachment features 156 form a separation plane 158 in the glass substrate 104, which can be used to separate the glass substrate 104 from the glass wafer 114, or to remove a section of the glass substrate 104. The separation plane 158 is a cross-sectional plane that extends perpendicular to the first and second substantially planar surfaces 118, 120. The glass substrate 104 is thinner and/or mechanically weaker than adjacent portions of the glass substrate 104 in the separation plane 158. As a result, the glass substrate 104 will break along the separation plane 158 when mechanical pressure is applied in the vicinity of the separation plane 158. Additionally or alternatively, the glass substrate 104 can be more easily cut or etched along the separation plane 158 than adjacent portions of the glass substrate 104.

In each of the embodiments described with reference to FIGS. 12-15, forming the through-vias 128 and forming the detachment features 156 comprises a laser induced etching process. This means that both features are formed by initially forming laser-treated regions in the glass substrate 104 and subsequently etching the laser-treated regions. Some or all of these steps may be common to one another. For example, the same laser that is used to form the first laser-treated regions 124 can be used (at the same or different energy) to form the detachment features 156. In addition or in the alternative, the same etching step used to form the first perforations 126 may be used to form the detachment features 156. As the laser induced etching is highly flexible in this regard, the detachment feature 156 can easily be formed to have a different geometry, depth, pattern, etc. as the through-vias 128, while simultaneously reducing the number of processing steps needed to form the completed current measurement device 102.

Referring to FIG. 12 a technique for forming the central opening 108 in the glass substrate 104 using the laser induced etching process is depicted, according to an embodiment. According to this technique, the glass substrate 104 is provided (as shown in FIG. 12A) and laser energy 122 is applied to the first and second substantially planar surfaces 118, 120 (as shown in FIG. 12B). During this step, the first laser-treated regions 124 are formed in the glass substrate 104 in the manner previously described. Additionally, a plurality of second laser-treated regions 160 are formed by the laser treatment. The second laser-treated regions 160 are formed in a pattern which surrounds a central portion 162 of the glass substrate 104. The second laser-treated regions 160 can be formed with different process parameters as the first laser-treated regions 124 such that both regions are not etched at the same rate. For example, the laser process can be changed so that less energy is used to form the second laser-treated regions 160. This may be done by shortening the laser pulse (e.g., from 100 ns to 70 ns). In addition or in the alternative, a coating (not shown) may be applied on the glass substrate 104 in the desired location of the second laser-treated regions 160 so that some of the laser energy 122 is reflected or absorbed.

Subsequently, as shown in FIG. 12C, an etching process is performed. The etching process may include applying a wet chemical etchant (e.g., (e.g., fluor/fluorine containing or based etchant, or HF) in a similar manner as previously described. The etching process forms the plurality of first perforations 126 in the glass substrate 104 in the manner previously described. Additionally, the etching process forms from the second laser-treated regions 160 the detachment features 156 as trenches or grooves in the glass substrate 104. These trenches are formed in opposite facing pairs of trenches that are separated from one another by a thinner section of the glass substrate 104. These opposite facing pairs of trenches define the separation plane 158 in the glass substrate 104 that surrounds the central portion 162 of the glass substrate 104. Because the second laser-treated regions 160 are formed using a different energy as the first laser-treated regions 124, the first perforations 126 and the detachment features 156 can be formed simultaneously by a common etching step. Alternatively, the opposite facing pairs of trenches can be formed by a separate etching step that uses the same or different etchant chemical than the etchant used to form the first perforations 126.

Subsequently, as shown in FIGS. 12D and 12E, the through-vias 128 are formed and the first and second metallization layers 130, 132 are formed and structured in the manner previously described. In this case, the first and second metallization layers 130, 132 are patterned such that the opposite facing pairs of trenches and the central portion 162 of the glass substrate 104 that is between the opposite facing pairs of trenches are exposed from the metallization.

Subsequently, as shown in FIG. 12F, the central portion 162 of the glass substrate 104 is separated from the substrate. In this case, the thinner sections of the glass substrate 104 form the separation plane 158 that enables separation of the central portion 162. According to an embodiment, the central portion 162 of the glass substrate 104 is separated by applying mechanical pressure to the central portion 162 until the thinner sections of the glass substrate 104 break.

The opposite facing pairs of trenches can be formed in a regular pattern with multiple pairs of these trenches surrounding the central portion 162 of the glass substrate 104. Alternatively, a single opposite facing pair of trenches may be formed with a continuous enclosed shape that surrounds the central portion 162 of the glass substrate 104 from a plan-view perspective of the glass substrate 104. In either case, the thickness of the thinner sections of the glass substrate 104 can be selected so that these features provide sufficient mechanical support to keep the glass substrate 104 intact during each of the processing steps, while simultaneously providing a separation plane 158 that can easily be broken or cut.

Figure 13:
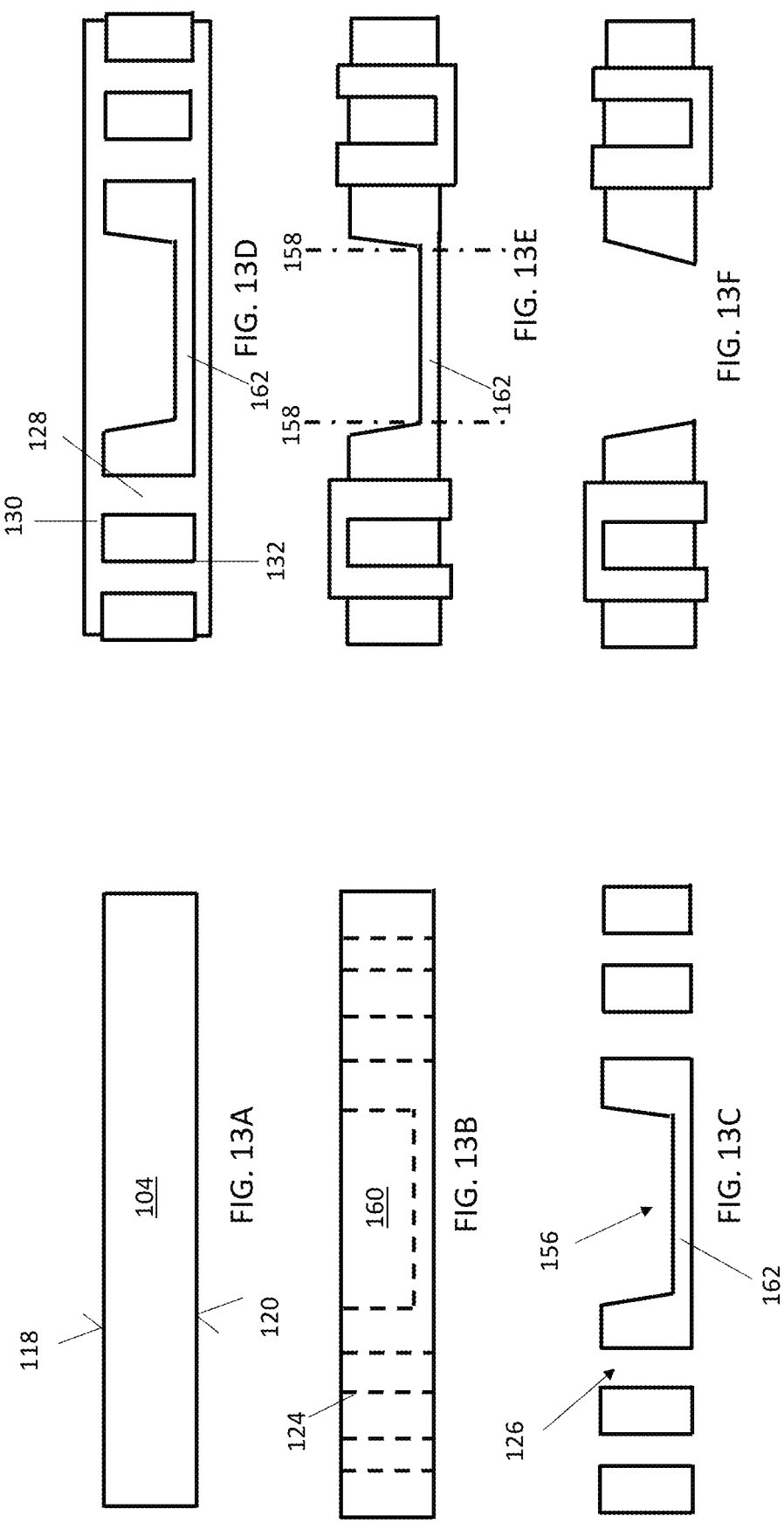
FIG. 13, which includes

Referring to FIG. 13, a technique for forming detachment features 156 as trenches in the glass substrate 104 is depicted, according to another embodiment. In this case, the detachment features 156 are configured as a trench that extends from the first substantially planar surface 118 to a trench bottom, with a thinner portion of the glass substrate 104 between the bottom of the trench and the second substantially planar surface 120. Different to the previously discussed embodiment, the trench is formed within the central portion 162 of the glass substrate 104 and may cover the entire area of the central portion 162 of the glass substrate 104.

The trench that provides the detachment feature 156 can be formed by the laser induced etching technique according to the previously described techniques. Different laser energy 122 can be used to form the second laser-treated region 160 in the manner previously described so as to provide a trench in combination with the first perforations 122.

After forming the trench in the central portion 162 of the glass substrate 104, the central portion 162 of the glass substrate 104 can be removed along a separation plane 158 that coincides with corners of the trench wherein the glass substrate 104 transitions from thinner to thicker. In an embodiment, this separation is done by applying mechanical pressure until the thinner section breaks.

Instead of removing the central portion 162 of the glass substrate 104, in another embodiment the central portion 162 of the glass substrate can remain intact. In that case, an electronic device such as a semiconductor chip can be placed directly within the cavity and the coil can operate as a current measurement device for this electronic device. Additional through-vias can be formed within the central portion 162 of the glass substrate 104 to provide electrical connectivity and/or thermal dissipation.

Figure 14:
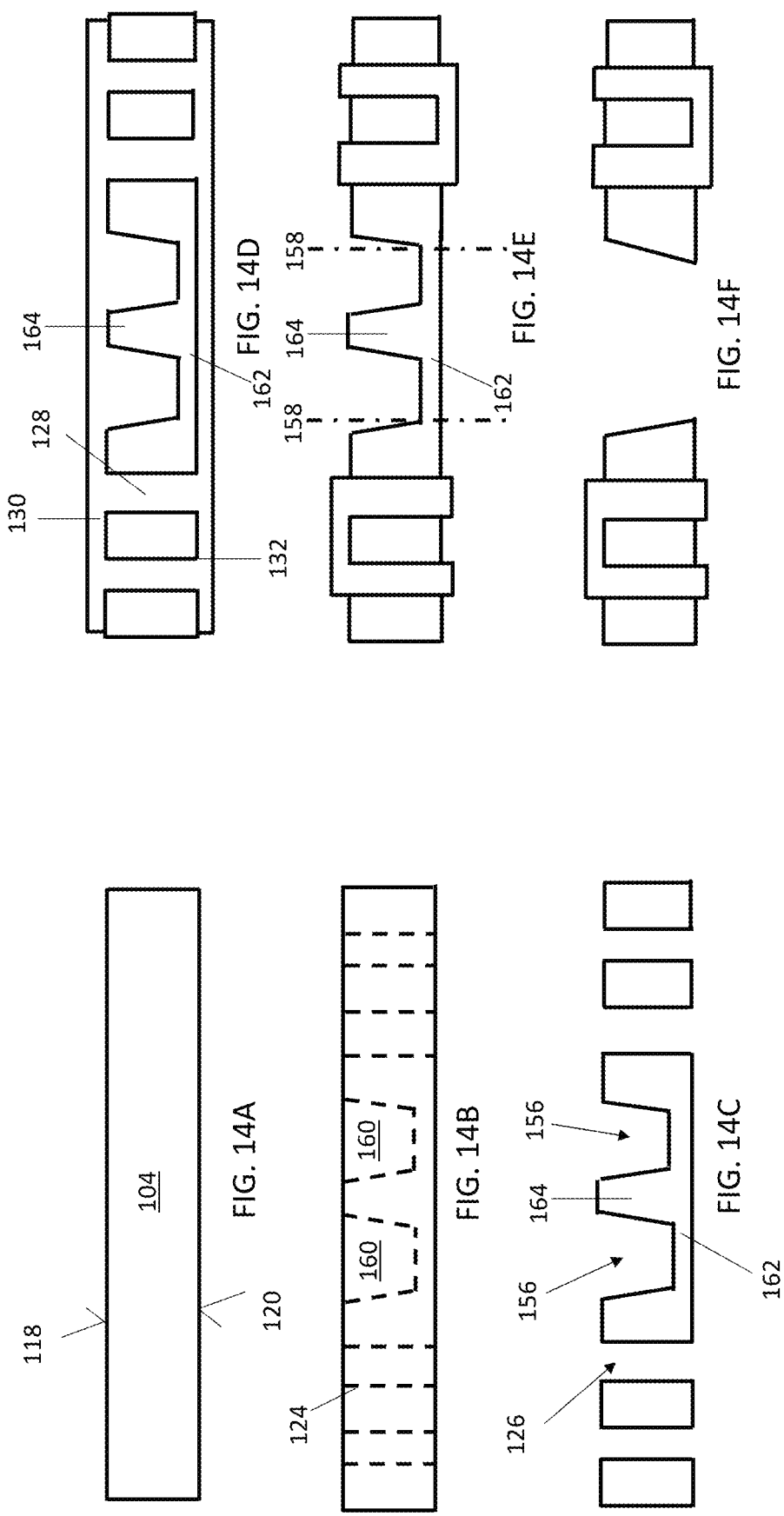
FIG. 14, which includes

Referring to FIG. 14, a technique for forming detachment features 156 as trenches in the glass substrate 104 is depicted, according to another embodiment. In this embodiment, the detachment features 156 include at least two of the trenches that extend from the first substantially planar surface 118 and are disposed within the central portion 162 of the glass substrate 104. The trenches are separated from one another by a thicker section 164 of the glass substrate 104 that is part of the central portion 162 of the glass substrate 104 that is ultimately detached. The technique used to form these trenches can be identical to that described above with reference to FIG. 13, except that the laser activation and/or the etching step is performed in such a way that certain portions of the glass substrate 104 that are within the central portion 162 of the glass substrate 104 are not etched. This technique may be preferable because the thicker sections 164 enhance the mechanical strength of the glass substrate 104 and thus prevent bowing of the glass substrate 104 during processing.

Figures 15, 15C:
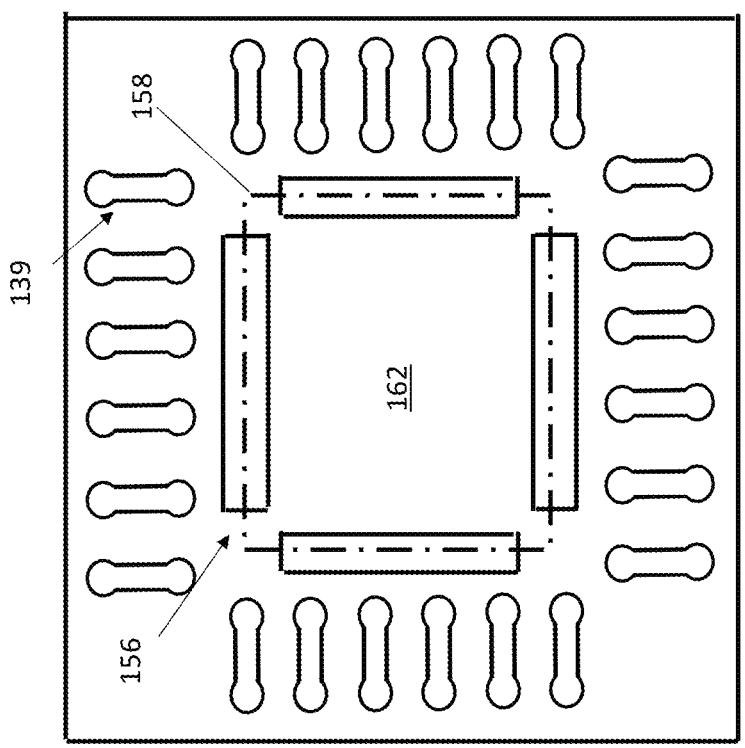

Referring to FIG. 15, a technique for forming detachment features 156 is depicted, according to an embodiment. In this case, the detachment features 156 are provided by a plurality of second perforations, i.e., complete openings which penetrate the glass substrate 104. These second perforations may be larger and/or have a different geometry as the first perforations 126 used to form the through vias 128. However, the second perforations can be formed using the same laser application and etching steps used to form the first perforations 126.

The second perforations operate as detachment features 156 by defining a separation plane 158 in the substrate which extends through bridging portions of the glass substrate 104 that are disposed between immediately adjacent ones of the perforations. The glass substrate 104 is mechanically weaker along this separation plane 158. By applying mechanical pressure to the central portion 162, the bridging portions of the glass substrate 104 break and the central portion 162 detaches.

FIGS. 15A-15C represent three potential geometric configurations of the second perforations which create a separation plane 158 that surrounds the central portion 162 of the glass substrate 104. Various modifications of the size, location and geometry of the second perforations that enable separation by the same concept are possible. Generally speaking, the second perforations can be formed in such a way that the bridging portions of the glass substrate 104 have sufficient thickness so that these features provide sufficient mechanical support to keep the substrate intact during each of the processing steps, while simultaneously providing a separation plane 158 that can be easily broken or cut.

The various embodiments for forming the detachment features 156 and separating the glass substrate 104 described with reference to FIGS. 12-15 can be combined with one another. In one example, the technique of FIG. 15 is combined with the technique of FIG. 12 such that the bridging portions of the substrate include opposite facing pairs of trenches that form thinner portions of the glass substrate 104. In another example, the technique of FIG. 15 is combined with the technique of FIG. 13 or 14 to form one or more trenches in the central portion 162 of the glass substrate 104 that are surrounded by the second perforations.

Referring to FIG. 16, a current measurement device 102 is depicted, according to another embodiment. In this embodiment, the coil structure extends linearly between opposite facing ends of the glass substrate 104. In the single wound configuration of FIG. 16B, the first and second bond pads 140, 141 are located at these opposite facing ends of the glass substrate 104. In the rewound configuration of FIG. 16C, the coil structure doubles back so that both of the first and second bond pads 140, 141 are located at one end of the glass substrate 104. In either case, this coil structure does not curve or change direction. As a result, the coil structure can be formed in a unit section 116 of the glass wafer 114 which has a liner bar-shaped geometry. A linear bar-shaped geometry is an elongated shape with a centerline that extends substantially in a single direction and is devoid of a central opening.

One advantage of the linear bar-shaped geometry is that it makes efficient use of the glass wafer 114. As can be appreciated from FIG. 16A, the unit sections 116 of the glass substrate 104 can be formed directly adjacent to one another a space-efficient pattern that uses most of the glass material. In contrast to the pattern illustrated in FIG. 11B, no central opening 108 is created in the glass substrate 104 and thus no glass material is wasted. The unit sections 116 of the glass substrate 104 can be singulated from the glass wafer 114 using any separation technique, including the techniques described with reference to FIGS. 11-14 wherein detachment features 156 are formed around the unit sections 116 using a laser induced etching process. In addition or in the alternative, the techniques described with reference to FIGS. 11-14 can be used to form a glass wafer 114 with the same geometry as the unit sections 116 (e.g., rectangular) so that no glass material is wasted at the outer periphery of the glass wafer 114.

Figure 17:
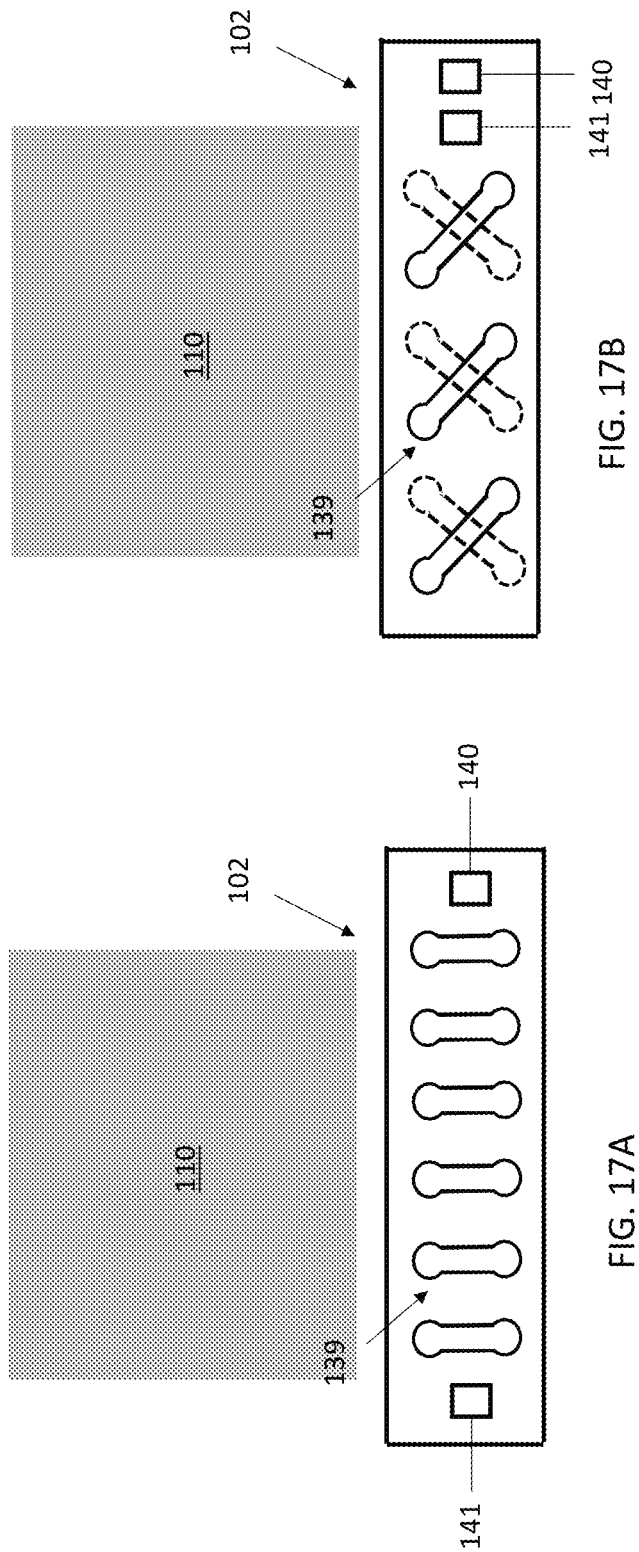
FIG. 17, which includes

FIG. 17 illustrates one potential implementation of a linear bar-shaped current measurement device 102 for measuring current. In this case, linear bar-shaped current measurement device 102 is mounted adjacent to one side of the first semiconductor die 110, i.e., the device being measured. Although this arrangement may be less effective at current measurement in comparison to a configuration wherein the coil completely surrounds the device being measured (e.g., as shown in FIG. 1), the one-sided arrangement may nevertheless provide sufficiently rapid and accurate current detection in many applications.

Figure 18:
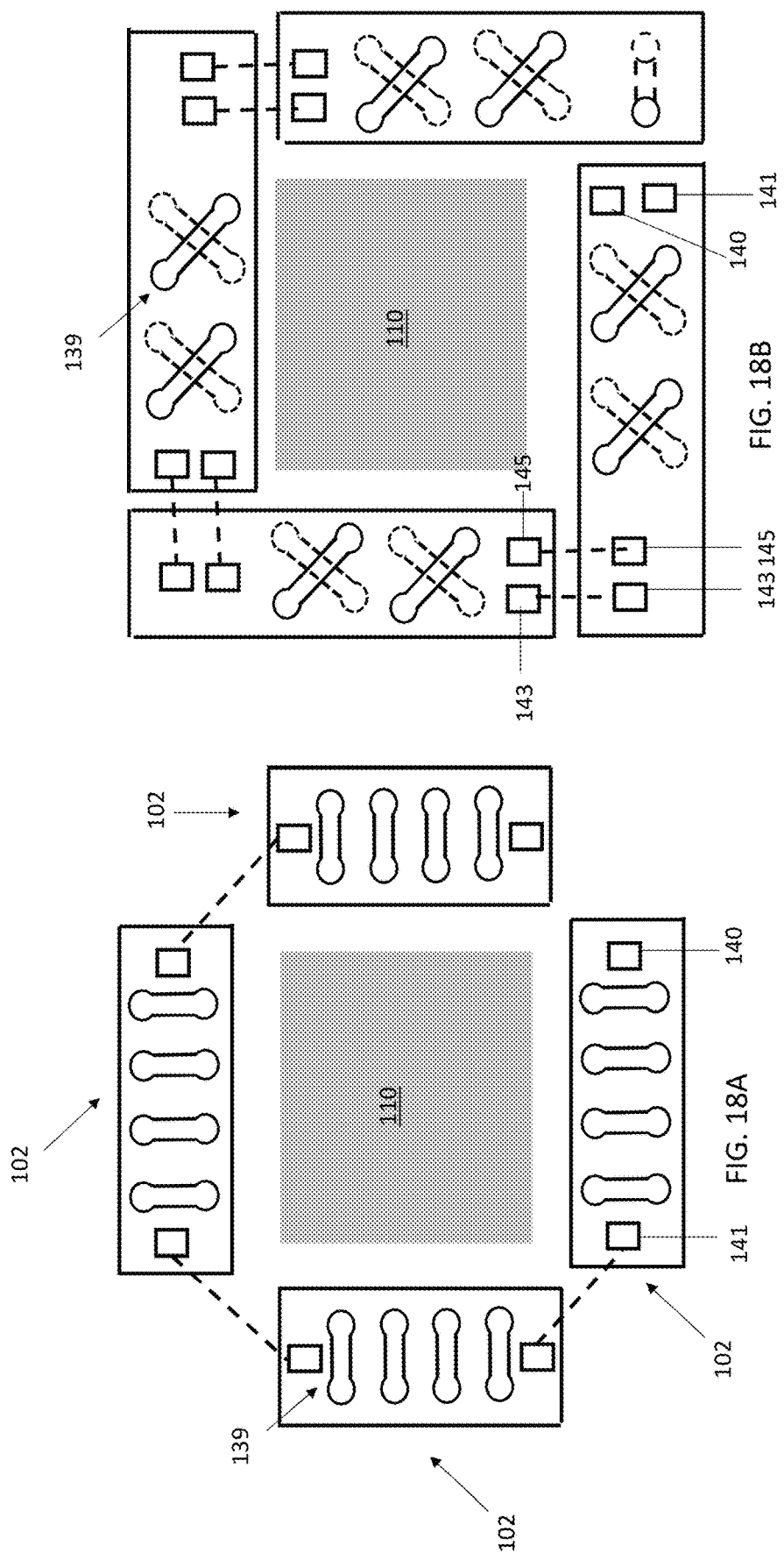
FIG. 18, which includes

FIG. 18 illustrates another potential implementation of the linear bar-shaped current measurement device 102 for measuring current. In this case, multiple ones of the linear bar-shaped current measurement devices 102 are strung together to obtain an arrangement wherein coil surrounds the first semiconductor die 110. The electrical connections between each component can be provided by conductive connectors such as bond wires, for example. In the case of the rewound configuration of FIG. 18B, the current measurement device 102 additionally includes third and fourth bond pads 143, 145, which provide additional connections to the windings in the lower and upper levels of metallization, respectively, so that the current measurement devices 102 can be strung together.

As depicted, four of the linear bar-shaped current measurement devices 102 are strung together such that the first semiconductor die 110 is completely surrounded. This arrangement therefore provides current measurement comparable to the enclosed loop configuration while simultaneously making efficient use of the glass material from the glass wafer 114. More generally, the concept can be implemented using any number of the linear bar-shaped current measurement device 102. The number and arrangement of these linear bar-shaped elements can be based on a number of considerations such as desired measurement accuracy and/or geometry of the device being measured.

Figure 19:
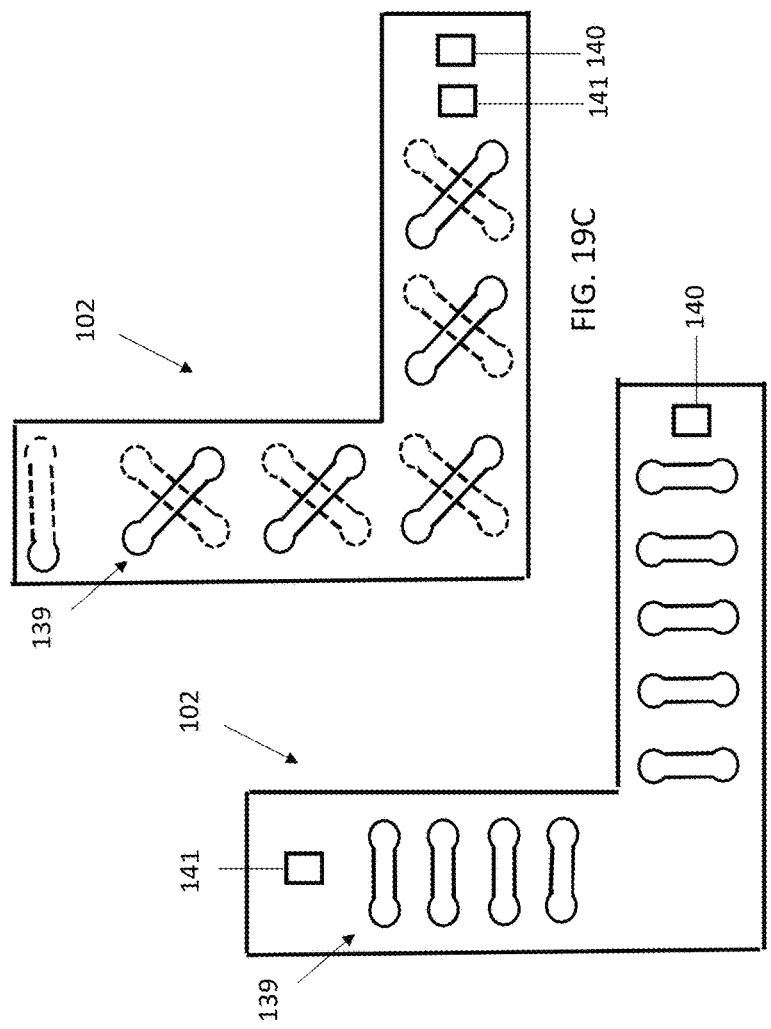
FIG. 19, which includes

Referring to FIG. 19, a current measurement device 102 is depicted, according to another embodiment. In this embodiment, the coil structure extends in two directions that are perpendicular to one another. As a result, the coil structure can be formed in a unit section 116 of the glass wafer 114 which has an L-shaped geometry. An L-shaped geometry refers to a geometry with two elongated spans wherein the center lines of the elongated spans are substantially perpendicular to one another. As can be appreciated from FIG. 19A, the L-shaped geometry also makes efficient use of the glass wafer 114, as the individual L-shapes can be part of a nested pattern. Similar to the previous embodiment, there is no central portion of each unit section 116 that is removed.

As shown in FIG. 20, the L-shaped current measurement device 102 can be arranged that it is adjacent to two sides of the first semiconductor die 110. It therefore offers greater current sensitivity in comparison to a one-sided current measurement configuration. In another embodiment (not depicted) two of the L-shaped current measurement devices 102 are mounted around the first semiconductor die 110 so that all four sides of the first semiconductor die 110 face a portion of the coil structure. These two L-shaped current measurement devices 102 can be strung together in a similar manner as described above. Thus, the L-shaped geometry represents another way to obtain accurate current measurement while simultaneously making efficient use of the glass material from the glass wafer 114.

The term "substantially" as used herein encompasses absolute conformity with the specified requirement as well as minor deviations from absolute conformity with the requirement due to manufacturing process tolerance windows. Provided that the component performs as intended within acceptable tolerance ranges (e.g., within +/−5% current measurement accuracy), the term "substantially" encompasses any variation within these process tolerance windows.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method of forming a current measurement device, the method comprising:
   providing a glass substrate comprising first and second substantially planar surfaces that are opposite one another;
   forming a plurality of through-vias in the glass substrate that each extend between the first and second substantially planar surfaces; and
   forming conductive tracks on the glass substrate that connect adjacent ones of the through-vias together,
   wherein forming the plurality of through-vias comprises applying radiation to the glass substrate,
   wherein the conductive tracks and the through-vias collectively form a coil structure in the glass substrate.

2. The method of claim 1, wherein applying radiation to the glass substrate comprises:
   applying laser energy to the first substantially planar surface to form a plurality of first laser-treated regions in the glass substrate; and
   etching each of the first laser-treated regions to form a plurality first laser-treated regions that extend between the first and second substantially planar surfaces, and
   wherein the through-vias are formed in the perforations.

3. The method of claim 2, wherein etching the laser-treated surfaces comprises applying an etchant to an unmasked region of the first substantially planar surface that comprises the first laser-treated regions and non-laser-treated regions, and wherein the etchant has a greater etching rate to the first laser-treated regions than the non-laser-treated regions.

4. The method of claim 2, wherein the first perforations are formed by applying the laser energy exclusively to the first substantially planar surface.

5. The method of claim 4, wherein forming the through-vias comprises:
   forming a second metallization layer on the second substantially planar surface before applying the laser energy to the first substantially planar surface; and
   performing a metal plating process that fills the first perforations with conductive metal.

6. The method of claim 5, further comprising:
   forming a first metallization layer on the second substantially planar surface after applying the laser energy to the first substantially planar surface, and
   wherein forming the conductive tracks comprises structuring each of the first and second metallization layers.

7. The method of claim 3, wherein applying radiation to the glass substrate process further comprises applying laser energy to the second substantially planar surface, and wherein the laser energy applied to the second substantially planar surface substantially aligns with the first laser-treated regions.

8. The method of claim 7, wherein forming the through-vias comprises:
   forming a seed layer that lines sidewalls of the first perforations; and
   performing a metal plating process that uses the seed layer deposit conductive metal thereon.

9. The method of claim 8, wherein the metal plating process is performed such that a first metallization layer forms on the first substantially planar surface and such that a second metallization layer forms on the second substantially planar surface, and wherein forming the conductive tracks comprises structuring each of the first and second metallization layers.

10. A method of forming a current measurement device, the method comprising:
    providing a glass substrate comprising first and second substantially planar surfaces that are opposite one another;
    forming through-vias in the glass substrate that extend between the first and second substantially planar surfaces;
    forming a coil structure in the glass substrate that comprises a plurality of conductive windings, each of the conductive windings comprising a pair of the through-vias;
    forming a plurality of detachment features in the glass substrate; and
    separating a first section of the glass substrate by using the detachment features, and
    wherein forming the through-vias and forming the detachment features comprises applying radiation to the glass substrate.

11. The method of claim 10, wherein forming the through-vias and forming the detachment features comprises:
    applying laser energy to the glass substrate to form a plurality of first laser-treated regions and a plurality of second laser-treated regions;
    etching each of the first laser-treated regions to form a plurality of first perforations in the glass substrate; and
    etching each of the second laser-treated regions to form a plurality of second perforations or one or more trenches in the glass substrate,
    wherein the through-vias are formed in the plurality of first perforations, and
    wherein the detachment features comprise the plurality of second perforations or one or more trenches.

12. The method of claim 11, wherein the laser energy is applied such that the second laser-treated regions are formed with less laser energy than the first laser-treated regions, and wherein etching each of the second laser-treated regions forms the detachment features to comprise the one or more trenches.

13. The method of claim 12, wherein the one or more trenches are formed to comprise pairs of the trenches that are separated from one another by a thinner section of the glass substrate, and wherein the opposite facing pairs of the trenches define a separation plane in the glass substrate that surrounds the first section of the glass substrate.

14. The method of claim 12, wherein the one or more trenches are formed to extend from the first substantially planar surface and are formed within the first section of the glass substrate.

15. The method of claim 14, wherein the one or more trenches are formed to comprise a pair of the trenches that are separated from one another by a thicker section of the glass substrate that is part of the first section of the glass substrate.

16. The method of claim 11, wherein separating the first section of the glass substrate comprises mechanically breaking a thinner portion of the glass substrate that is formed by the one or more trenches.

17. The method of claim 10, wherein etching each of the second laser-treated regions forms the detachment features to comprise the plurality of second perforations, and wherein the second perforations define a separation plane in the glass substrate that surrounds the first section of the glass substrate.

18. The method of claim 17, wherein separating the first section of the glass substrate comprises breaking portions of the glass substrate that are between the second perforations.

19. The method of claim 10, wherein the coil is disposed within the first section of the glass substrate.

20. The method of claim 10, wherein the coil surrounds the first section of the glass substrate.

21. A current measurement device, comprising:
a glass substrate comprising first and second substantially planar surfaces that are opposite one another;
a plurality of through-vias in the glass substrate that each extend between the first and second substantially planar surfaces; and
conductive tracks formed on the glass substrate that connect adjacent ones of the through-vias together, and wherein the conductive tracks and the through-vias collectively form a coil structure in the glass substrate.

22. The current measurement device of claim 21, wherein windings of the coil structure comprise a pair of the through-vias and one of the conductive tracks electrically connecting the pair of the through-vias together.

23. The current measurement device of claim 22, wherein the current measurement device comprises a first metallization layer formed on the first substantially planar surface and a second metallization layer formed on the second substantially planar surface, and wherein the conductive tracks are formed in the first and second metallization layers.

24. The current measurement device of claim 23, wherein the conductive tracks that are formed in the first metallization layer have a first pattern, and wherein the conductive tracks that are formed in the second metallization layer have a second pattern that is different from the first pattern.

25. The current measurement device of claim 22, further comprising:
a third metallization layer that is formed over the first metallization layer and is insulated from the first metallization layer by a first interlayer dielectric; and
a fourth metallization layer that is formed over the second metallization layer and is insulated from the second metallization layer by a second interlayer dielectric, and
wherein the conductive tracks are formed in the third and fourth metallization layers.

26. The current measurement device of claim 25, wherein the coil structure is rewound such that the windings formed by the conductive tracks in the first and second metallization layers are interleaved with the windings formed by the conductive tracks in the third and fourth metallization layers.

27. The current measurement device of claim 22, wherein the coil structure is configured as a Rogowski coil.

28. The current measurement device of claim 21, wherein the glass substrate forms an enclosed loop around a central opening, and wherein the coil at least partially surrounds the central opening.

29. The current measurement device of claim 21, wherein the glass substrate has a linear bar-shaped geometry, and wherein the coil structure extends linearly between opposite facing ends of the glass substrate.

30. The current measurement device of claim 21, wherein the glass substrate has an L-shaped geometry with two perpendicular spans, and wherein the coil structure extends along both of the two perpendicular spans.

* * * * *